US010641823B2

(12) United States Patent
Lu et al.

(10) Patent No.: US 10,641,823 B2
(45) Date of Patent: May 5, 2020

(54) METHOD AND APPARATUS FOR BUILT-IN SELF-TEST OF CDR AND NON-CDR COMPONENTS WITH AN ON SUBSTRATE TEST SIGNAL GENERATOR

(71) Applicant: Photonic Technologies (Shanghai) Co., Ltd., Shanghai (CN)

(72) Inventors: Ming Lu, Shanghai (CN); Patrick Yin Chiang, Shanghai (CN); Jianxu Ma, Shanghai (CN); Rui Bai, Shanghai (CN); Xuefeng Chen, Shanghai (CN); Juncheng Wang, Shanghai (CN)

(73) Assignee: Photonic Technologies (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 15/773,304

(22) PCT Filed: Mar. 17, 2017

(86) PCT No.: PCT/CN2017/077067
§ 371 (c)(1),
(2) Date: May 3, 2018

(87) PCT Pub. No.: WO2018/165976
PCT Pub. Date: Sep. 20, 2018

(65) Prior Publication Data
US 2020/0003830 A1    Jan. 2, 2020

(51) Int. Cl.
*G01R 31/28* (2006.01)
(52) U.S. Cl.
CPC ..... *G01R 31/2884* (2013.01); *G01R 31/2856* (2013.01)

(58) Field of Classification Search
CPC .... H04B 10/40; H04B 10/69; H04B 10/5161; H04B 14/026; H04B 10/0795; H04B 10/2507; H04B 10/60; H04B 10/07955; H04B 10/697; H04B 10/03; H04B 10/07; H04B 10/0775; H04B 10/0793; H04B 10/504; H04B 1/16; H04B 1/71637; H04L 12/46; H04L 1/205; H04L 1/242; H04L 25/03343; H04L 7/0337; H04L 7/10;
(Continued)

(56) References Cited
U.S. PATENT DOCUMENTS 7,519,130 B2 *  4/2009  Hsu ..................... H04L 25/0274
                                                    326/30
8,811,458 B2 *  8/2014  Kong ............... G01R 31/31709
                                                    375/219
(Continued)

FOREIGN PATENT DOCUMENTS

CN    102664041 A    9/2012
CN    104954044 A    9/2015

*Primary Examiner* — Vinh P Nguyen
(74) *Attorney, Agent, or Firm* — IPro, PLLC

(57) ABSTRACT

An apparatus comprises one or more non-clock and data recovery (CDR) components on a substrate, a signal generator on the substrate and coupled to at least one of the one or more non-CDR components, and a CDR component on the substrate and coupled to the one or more non-CDR components, wherein the CDR component is configured to recover clock data from a received signal by the CDR component, and configured to determine a signal based on the received signal and the clock data.

12 Claims, 16 Drawing Sheets

(58) Field of Classification Search
CPC . H04L 7/0004; G06F 1/06; G06F 1/12; G06F 13/385; G06F 13/00; G06F 13/10; G06F 13/12; H03K 19/20; H03K 19/21; H03K 9/00; H03K 9/02; G01N 27/4141; G01N 27/4145; G01N 27/4146; G01N 27/4148; G01N 27/44747; G01N 27/44791; G01N 33/68; G01N 33/6812; G01N 33/6818; H03L 7/0805; H03L 7/089; H03L 7/091; H03L 7/07; H03L 7/0814

See application file for complete search history.

(56) References Cited

U.S. PATENT DOCUMENTS

| | | | |
|---|---|---|---|
| 9,176,188 B2 * | 11/2015 | Chakraborty | G01R 31/31716 |
| 9,255,966 B2 * | 2/2016 | Onodera | H04L 1/205 |
| 9,680,631 B2 * | 6/2017 | Tsunoda | H04B 10/541 |
| 10,298,330 B2 * | 5/2019 | Tatum | H04B 10/40 |
| 2014/0098843 A1 | 4/2014 | Kong et al. | |
| 2014/0269872 A1 | 9/2014 | Onodera | |
| 2015/0177326 A1 | 6/2015 | Chakraborty et al. | |

* cited by examiner

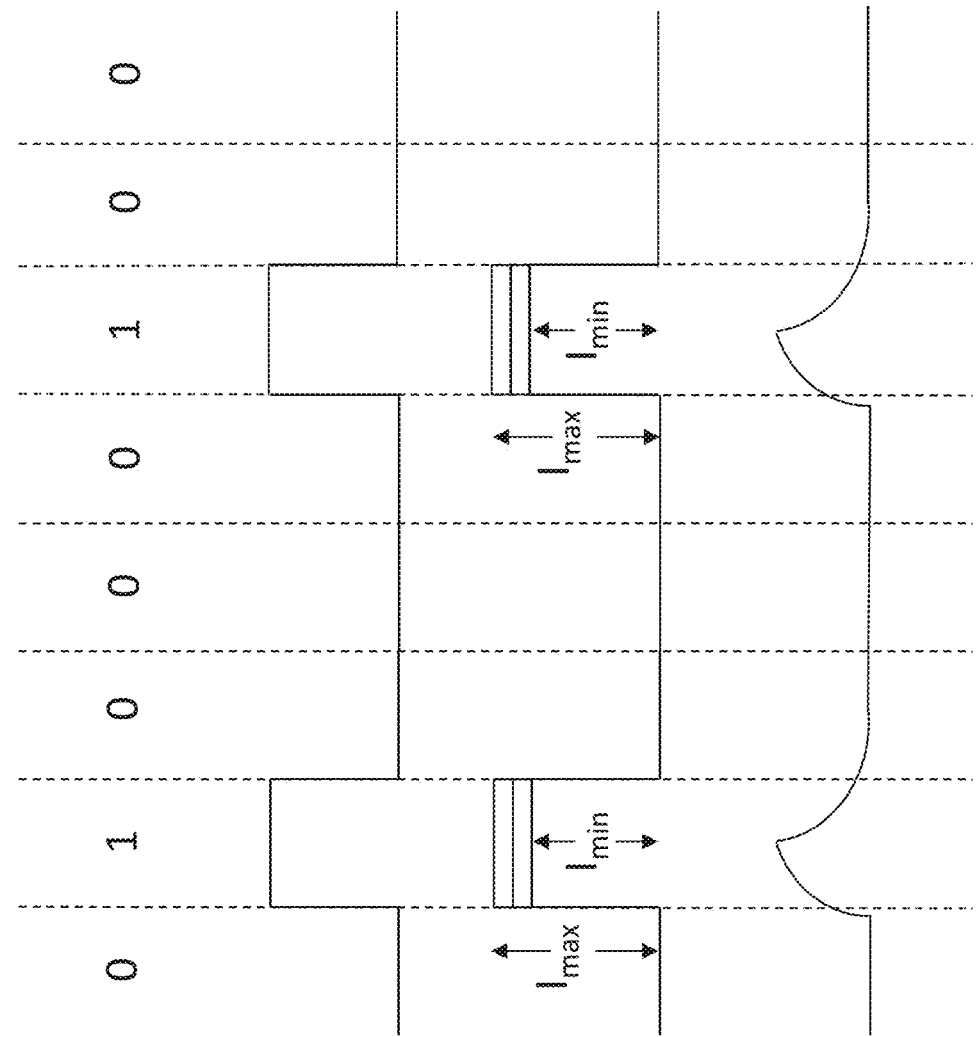

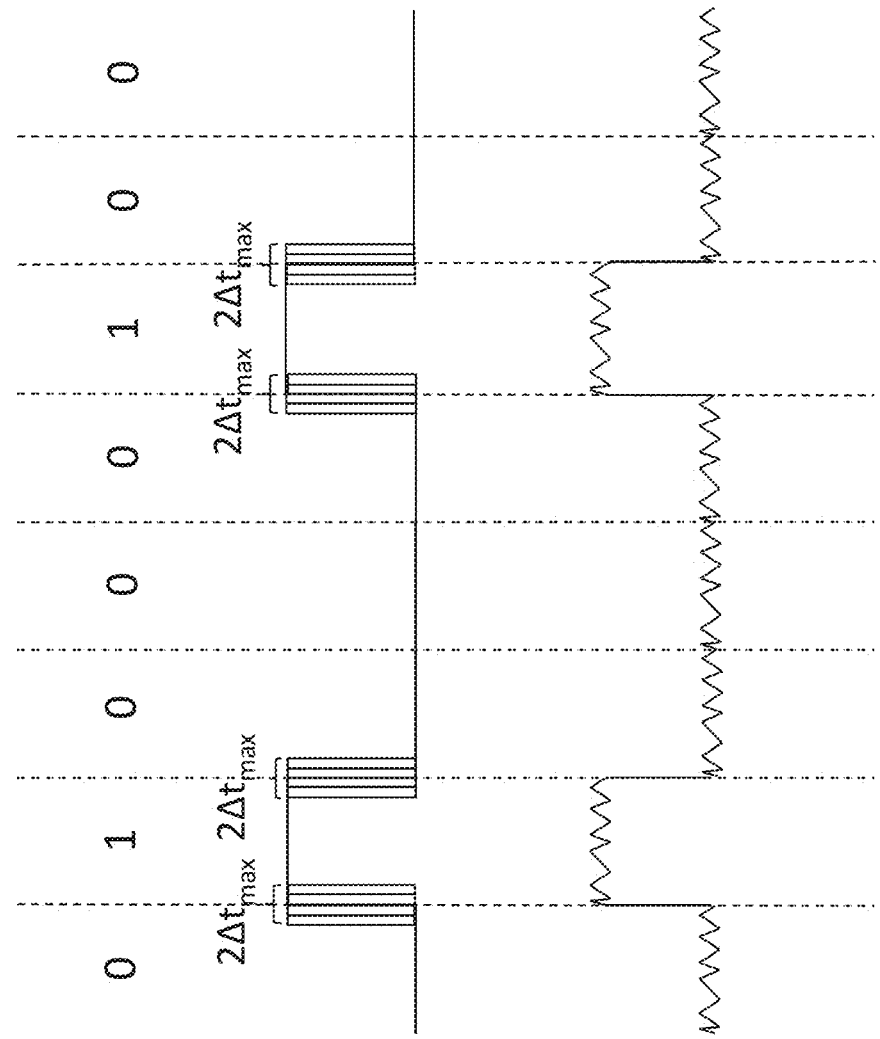

METHOD AND APPARATUS FOR BUILT-IN SELF-TEST OF CDR AND NON-CDR COMPONENTS WITH AN ON SUBSTRATE TEST SIGNAL GENERATOR

BACKGROUND

1. Technical Field

The present teaching relates generally to methods, apparatuses, and programming related to built-in self-test (BIST). In particular, the present teaching relates to an apparatus suitable for performing BIST, and a method and programming for manufacturing the apparatus and performing BIST of the apparatus.

2. Discussion of Technical Background

A BIST is a mechanism that permits a device, for example, an integrated circuit (IC) device, to test itself. In IC designs, one or more testing components may be manufactured as part of an IC device, used for performing BIST of the IC device after manufactured. Without relying upon external test equipment for performing such test, the complexity of testing setup is greatly reduced, thereby decreasing cost, particularly for mass production.

SUMMARY

It may be desirable to perform BIST of any component or any group of components of interest in a device. In some instances, the BIST is traditionally performed to monitor merely a specific component of the device, thereby limiting the applications of the BIST. For example, the BIST may be performed to test merely a clock and data recovery (CDR) component of a receiver. As a result, a broken component other than the CDR component in the receiver would not be identified even after the BIST is performed. Further, the traditional IC design may not support BIST of two or more components, as a whole, in the IC device (for example, the receiver as described herein). Thus, a need exists for improved method and apparatus applicable to perform BIST of any component or group of components of interest in the device.

The present teaching describes methods, systems, and programming related to BIST. In particular, the present teaching relates to an apparatus suitable for performing BIST, and a method and programming for manufacturing the apparatus and performing BIST of the apparatus.

In an exemplary embodiment, there is provided an apparatus comprising: one or more non-CDR components on a substrate; a signal generator on the substrate and coupled to at least one of the one or more non-CDR components; and a CDR component on the substrate and coupled to the one or more non-CDR components, wherein the CDR component is: configured to recover clock data from a received signal by the CDR component, and configured to determine a signal based on the received signal and the clock data.

In another exemplary embodiment, there is provided a method comprising: forming a signal generator, one or more non-CDR components, and a CDR component on a substrate, wherein the CDR component is: configured to recover clock data from a received signal by the CDR component, and configured to determine a signal based on the received signal and the clock data; coupling the CDR component to the one or more non-CDR components; and coupling the signal generator to at least one of the one or more non-CDR components.

In yet another exemplary embodiment, there is provided a method of using an apparatus, the apparatus comprising: one or more non-CDR components on a substrate; a signal generator on the substrate and coupled to at least one of the one or more non-CDR components; and a CDR component on the substrate and coupled to the one or more non-CDR components, wherein the CDR component is: configured to recover clock data from a received signal by the CDR component, and configured to determine a signal based on the received signal and the clock data, and the method comprising providing, by the signal generator, a test signal with one or more adjustable parameters.

Other concepts relate to software for manufacturing the apparatus as described herein and performing BIST on the apparatus. A software product, in accord with this concept, includes at least one machine-readable non-transitory medium and information carried by the medium.

In one exemplary embodiment, there is provided a machine-readable tangible and non-transitory medium having information, wherein the information, when read by a hardware processor system, causes the hardware processor system to perform following: forming a signal generator, one or more non-CDR components, and a CDR component on a substrate, wherein the CDR component is: configured to recover clock data from a received signal by the CDR component, and configured to determine a signal based on the received signal and the clock data; coupling the CDR component to the one or more non-CDR components; and coupling the signal generator to at least one of the one or more non-CDR components.

In another exemplary embodiment, there is provided a machine-readable tangible and non-transitory medium having information, wherein the information, when read by a hardware processor system, causes the hardware processor system to perform a process of using an apparatus, the apparatus comprising: one or more non-clock and data recovery (CDR) components on a substrate; a signal generator on the substrate and coupled to at least one of the one or more non-CDR components; and a CDR component on the substrate and coupled to the one or more non-CDR components, wherein the CDR component is: configured to recover clock data from a received signal by the CDR component, and configured to determine a signal based on the received signal and the clock data, and the process comprising providing, by the signal generator, a test signal with one or more adjustable parameters.

BRIEF DESCRIPTION OF THE DRAWINGS

The embodiments will be more readily understood in view of the following description when accompanied by the below figures and wherein like reference numerals represent like elements, wherein:

FIG. 4A illustrates an exemplary test signal provided directly by a signal generator;

FIGS. 4B-4E illustrate various test signals with adjustable: (4B) amplitude; (4C) bandwidth; (4D) jitter; and (4E) noise level, according to an embodiment of the present teaching;

DETAILED DESCRIPTION

Figure 1:
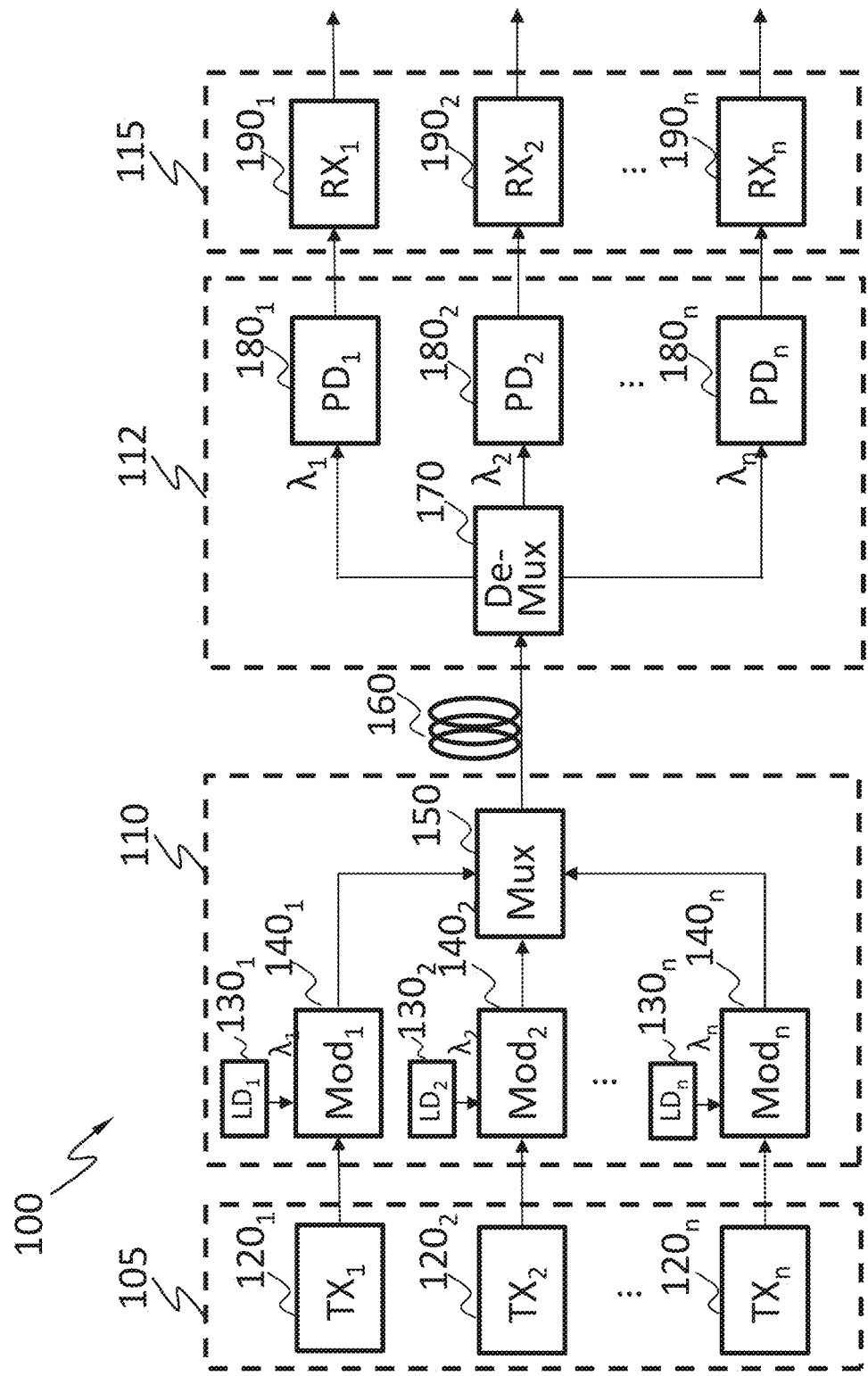
FIG. 1 is a high level depiction of an exemplary optical communication system, according to an embodiment of the present teaching.

Reference will now be made in detail to the embodiments of the present teaching, examples of which are illustrated in the accompanying drawings. While the present teaching will be described in conjunction with the embodiments, it will be understood that they are not intended to limit the present teaching to these embodiments. On the contrary, the present teaching is intended to cover alternatives, modifications, and equivalents, which may be included within the spirit and scope of the present teaching as defined by the appended claims.

In addition, in the following detailed description of embodiments of the present teaching, numerous specific details are set forth in order to provide a thorough understanding of the present teaching. However, it will be recognized by one of ordinary skill in the art that the present teaching may be practiced without these specific details. In other instances, well-known methods, procedures, components, and circuits have not been described in detail as not to unnecessarily obscure aspects of the embodiments of the present teaching.

The present teaching provides methods, apparatuses, and programming related to BIST. In particular, the present teaching provides an apparatus suitable for performing BIST, and a method and programming for manufacturing the apparatus and performing BIST of the apparatus. For example, using the methods and programming provided herein, an apparatus, for example, in form of a silicon chip, may include a signal generator and a signal checker in addition to one or more non-clock and data recovery (CDR) components and a CDR component. In an embodiment, the one or more non-CDR components may include one or more amplifiers, such as a trans-impedance amplifier or a limiting amplifier. The signal generator may be coupled to at least one of the one or more non-CDR components. The signal generator may be used to provide a test signal for performing self-test. In an embodiment, the signal generator is a pseudo-random bit sequence (PRBS) generator. Accordingly, the signal checker may be coupled to the CDR component and/or at least one of the one or more non-CDR components. The signal checker may be used to determine a measure upon receipt of the test signal after the test signal passes through one or more components. In some embodiments, the measure may be indicative of a number of error bits received by the signal checker out of the pseudo-random bits provided by the signal generator. In an embodiment, the apparatus may further include a signal adjuster configured to adjust one or more parameters of the test signal provided by the signal generator. The one or more parameters of the test signal may include, but are not limited to, amplitude, bandwidth, jitter, and noise level. When performing BIST, the apparatus may be in communication with a control terminal in form of a computer, a mobile device, a portable digital assistant, and the like. The control terminal may send instructions to the signal adjuster to adjust the one or more parameters in order to evaluate the functionality of one or more components of the apparatus with respect to the test signal with different values of the one or more parameters. Further, the control terminal may determine a characteristic based on the measure obtained from the signal checker. Based on the characteristic, the control terminal may determine whether the one or more components of the apparatus function properly, for example, by comparing the characteristic with a threshold. In an embodiment, the characteristic is bit error rate, calculated as the ratio of the number of error bits determined by the signal checker to a total number of bits in the test signal provided by the signal generator. Thus, the control terminal may determine that the one or more components of the apparatus function properly when the bit error rate is within a threshold. Then, the apparatus may be ready to be sold to customers. Alternatively, the control terminal may determine that the one or more components of the apparatus function improperly when the bit error rate is out of the threshold. Then, the apparatus may be reworked, recycled, or discarded.

Such methods and systems as described herein advantageously facilitate the BIST of a component other than the CDR component, or a group of components in an IC device, which cannot be done before. In an embodiment, the IC device may be a receiver integrated on a silicon chip as described herein. Additional novel features will be set forth in part in the description which follows, and in part will become apparent to those skilled in the art upon examination of the following and the accompanying drawings or may be learned by production or operation of the examples.

FIG. 1 is a high level depiction of an exemplary optical communication system 100, according to an embodiment of the present teaching. As shown, the optical communication system 100 may include an optical fiber 160 with a suitable length (e.g., 5 meters, 10 meters, 100 meters, 1,000 meters, 10,000 meters, 100,000 meters, and the like) for long haul transmission. The optical communication system 100 may further include a transmitter chip 105, an encoder chip 110, a detector chip 112, and a receiver chip 115, each formed on a substrate (for example, a silicon substrate). Various components may be arranged as shown or in any other suitable manners.

The coupling between chips, for example, between the transmitter chip 105 and the encoder chip 110, and between the detector chip 112 and the receiver chip 115, may be achieved via wire bonding, flip chip packaging, or any other suitable means. The chip-to-fiber coupling, for example, between the encoder chip 110 and the optical fiber 160, or the fiber-to-chip coupling, for example, between the optical fiber 160 and the detector chip 112, may be achieved through a fiber grating, a fiber lens, any other suitable component or device.

The transmitter chip 105 may be configured to provide data to be transmitted in the optical communication system 100. As shown, the transmitter chip 105 includes a plurality of transmitters $120_{1-n}$ on a silicon substrate, where n can be any positive integer. Each of the transmitters $120_{1-n}$ may be configured to transmit a binary data sequence to a corresponding modulator $140_{1-n}$ of the encoder chip 110.

The encoder chip 110 may be configured to modulate the data provided by the transmitter chip 105 on lights with different wavelengths or frequencies, and combine the lights to be transmitted through the optical fiber 160. Specifically, the encoder chip 110 may include a plurality of laser diodes $130_{1-n}$, a plurality of modulators $140_{1-n}$ coupled to the plurality of laser diodes $130_{1-n}$, and a multiplexer 150 coupled to the plurality of modulators $140_{1-n}$, all formed on a silicon substrate. In an embodiment, the number of the laser diodes $130i-n$ is equal to the number of modulators $140_{1-n}$, which is no less than the number of transmitters $120_{1-n}$ in the transmitter chip 105. The plurality of laser diodes $130_{1-n}$ may be configured to provide a plurality of lights with different wavelengths $\lambda_1$-$\lambda_n$. Although not shown, each of the plurality of laser diodes $130_{1-n}$ may be driven by a respective laser diode driver, configured to provide the laser diode $130_{1-n}$ with required electrical currents to operate. Each of the plurality of modulators $140_1$-$140n$ may be configured to modulate date provided by one of the transmitters $120_{1-n}$ on a respective light inputted to the modulator $140_{1-n}$. The multiplexer 150 may be configured to combine the lights with various wavelengths into a single stream of lights to be transmitted to the optical fiber 160.

The detector chip 112 may be configured to receive the single stream of lights after transmitting through the optical fiber 160 and split the single stream of lights to a plurality of lights each with a different wavelength than others. The detector chip 112 may be further configured to convert each of the plurality of lights to an electrical current. Specifically, the detector chip 112 may include a de-multiplexer 170 and a plurality of photodiodes $180_{1-n}$ coupled to the de-multiplexer 170, all formed on a silicon substrate. In an embodiment, the number of photodiodes $180_{1-n}$ may be equal to, or no less than, the number of modulators $140_{1-n}$ and the number of laser diodes $130_{1-n}$ in the encoder chip 110. The de-multiplexer 170 may be configured to split the single stream of lights received from the optical fiber 160 to a plurality of lights each with a different wavelength than others. Each of the plurality of photodiodes $180_{1-n}$ may be configured to convert a corresponding received light to an electrical current, and transmit the electrical current to a corresponding receiver $190_{1-n}$.

The receiver chip 115 may be configured to recover the data provided by the transmitter chip 105 based on the plurality of electrical currents provided by the detector chip 112. Although not shown, each of the receivers $190_{1-n}$ may be further coupled to an electrical circuit for further operations through an appropriate driver in the receiver chip 115 or a separate chip.

Figure 2:
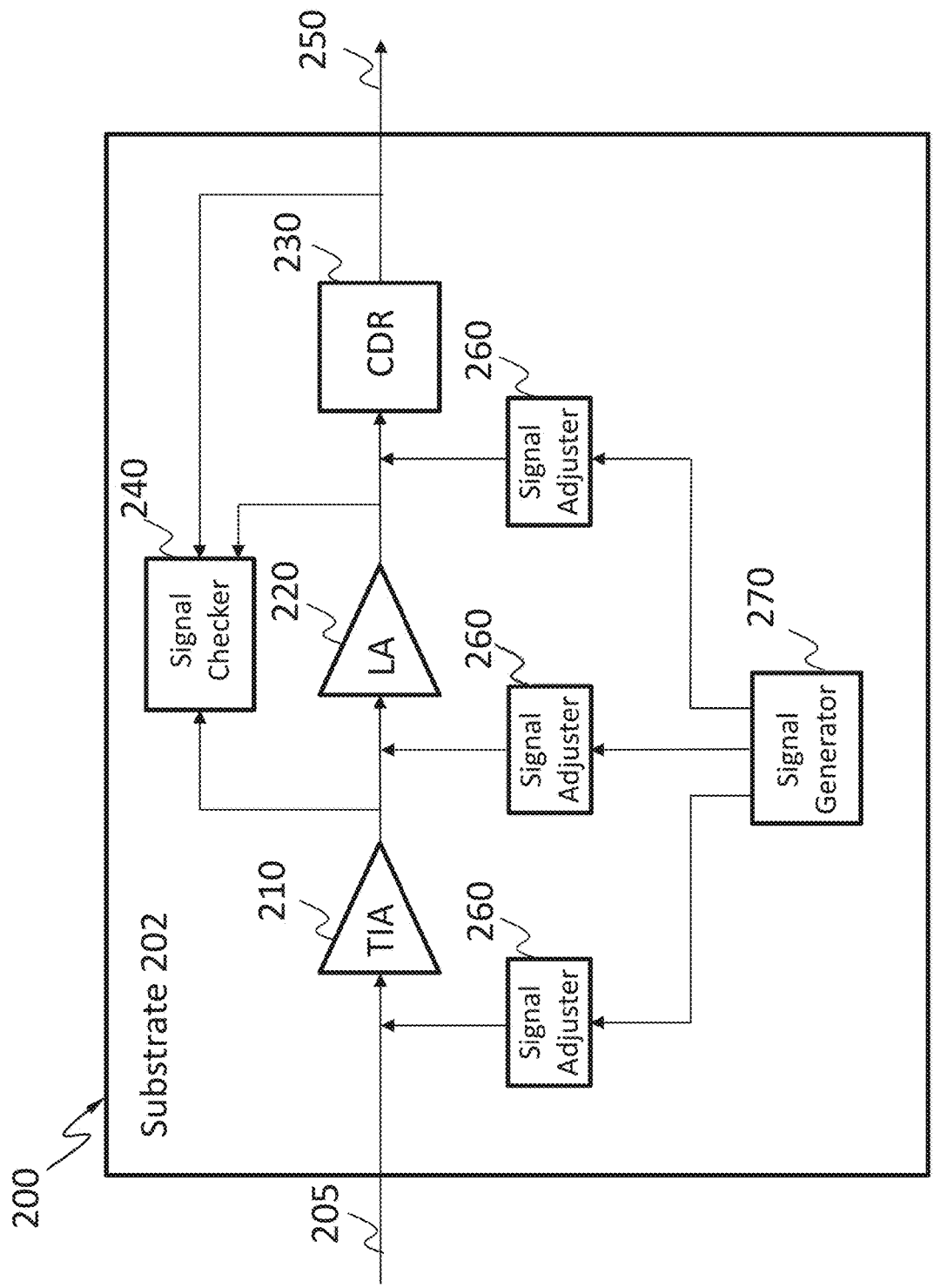
FIG. 2 is a schematic diagram of a receiver capable for built-in self-test (BIST), according to an embodiment of the present teaching.

FIG. 2 is a schematic diagram of a receiver 200 capable for BIST, according to an embodiment of the present teaching. The receiver 200 may be any one of the receivers $190_{1-n}$ in the receiver chip 115 in FIG. 1. As shown, the receiver 200 may be formed on a substrate 202, for example, a silicon substrate. The receiver 200 includes one or more amplifiers to convert an electrical signal 205 generated by an photodiode, e.g., one of the photodiodes $180_{1-n}$ in the detector chip 112 in FIG. 1, which can be a weak or strong signal, into a fixed-amplitude voltage signal. In an embodiment, the electrical signal 205 may be an electrical current signal. Further, the one or more amplifiers may include a trans-impedance amplifier (TIA) 210 which amplifies and converts the electrical signal 205 into a voltage signal. The one or more amplifiers may further include a limiting amplifier (LA) 220 configured to receive the voltage signal, which may have weak and strong voltage values, and convert the voltage signal into a fixed-amplitude voltage signal.

In an embodiment, the one or more amplifiers, such as the TIA 210 and the LA 220, may be configured as differential amplifiers. For example, the TIA 210 may generate differential output voltage signals, Tout and −Tout, at the same time. In addition, the LA 220 may generate differential output voltage signals, Lout and −Lout, having fixed amplitude at the same time.

The receiver 200 further includes a CDR component 230 configured to extract timing clock information from the fixed-amplitude voltage signal Lout and −Lout. The CDR component 230 may be further configured to reshapes the Lout signal waveform using the extracted clock signal to generate a recovered data signal 250. In an embodiment, the CDR component 230 may generates the timing clock information from an approximate frequency reference, and employ a phase-locked loop (PLL) to phase-align the clock to the transitions in the data stream, e.g., the Lout signal waveform. Alternatively or in addition, the CDR component 230 may employ a delay-locked loop circuit to change phase of a clock signal from a free-running clock and oversample the data stream, e.g., the Lout signal waveform, based on the modified clocking phases to generate the recovered data signal, e.g., the recovered data signal 250.

The receiver 200 further includes a signal generator 270 and a signal checker 240 to be used collectively for performing BIST. The signal generator 270 may be any suitable component configured to provide a test signal or a test pattern for performing BIST. In an embodiment, the signal generator 270 may be a PRBS generator configured to provide pseudo-random bits or a PRBS. The PRBS generator may, for example, employ a m-bit (m is a positive integer) shift register, realized by m D-type re-triggerable Flip-flops circuits, providing a PRBS with a length of (2m−1) bits. As shown, the signal generator 270 may have multiple output ports each of which enables the signal generator 270 to be coupled to the CDR component 230 or one of the one or more amplifiers (e.g., the TIA 210 or the LA 220), for example, through a signal adjuster 260 configured to configured to adjust one or more parameters of the test signal provided by the signal generator 270. The one or more parameters of the test signal may include, but are not limited to, amplitude, bandwidth, jitter, and noise level of the test signal. In an embodiment, only one output port of the signal generator 270 is turned on for each BIST. This is done so that only one test signal is provided for each BIST. Alternatively, the signal generator 270 may have only one output port. Accordingly, the signal generator 270 may be coupled to one of the amplifiers (e.g., the TIA 210 or the LA 220) through the output port and one signal adjuster 260.

The signal checker 240 may be coupled to the CDR component 230 and/or at least one of the amplifiers (e.g., the TIA 210 and the LA 220). In an embodiment, as shown in FIG. 2, the signal checker 240 is coupled to each of the CDR component 230, the TIA 210, and the LA 220. In an embodiment, the signal checker 240 is not coupled to each of the CDR component 230, the TIA 210, and the LA 220. For example, the signal checker 240 may be coupled only to the CDR component 230. For example, the signal checker 240 may be coupled only to the LA 220. For example, the signal checker 240 may be coupled only to the TIA 210. For example, the signal checker 240 may be coupled only to both the TIA 210 and the LA 220. For example, the signal checker 240 may be coupled only to both the TIA 210 and the CDR component 230. For example, the signal checker 240 may be coupled only to both the LA 220 and the CDR component 230.

The signal checker 240 may be used to determine a measure upon receipt of the test signal after the test signal passes through one or more components selected from a group consisting of the CDR component 230 and the one or more amplifiers (e.g., the TIA 210 and the LA 220). In an embodiment, the measure may be indicative of a number of error bits received by the signal checker 240 out of the pseudo-random bits provided by the signal generator 270. In an embodiment, the signal checker 240 is a counter, employing a m-bit (m is a positive integer) shift register, realized by m D-type re-triggerable flip-flops circuits, configured to count error bits of a binary bit pattern with a length of (2m−1) bits received by the signal checker 240.

Figure 15:
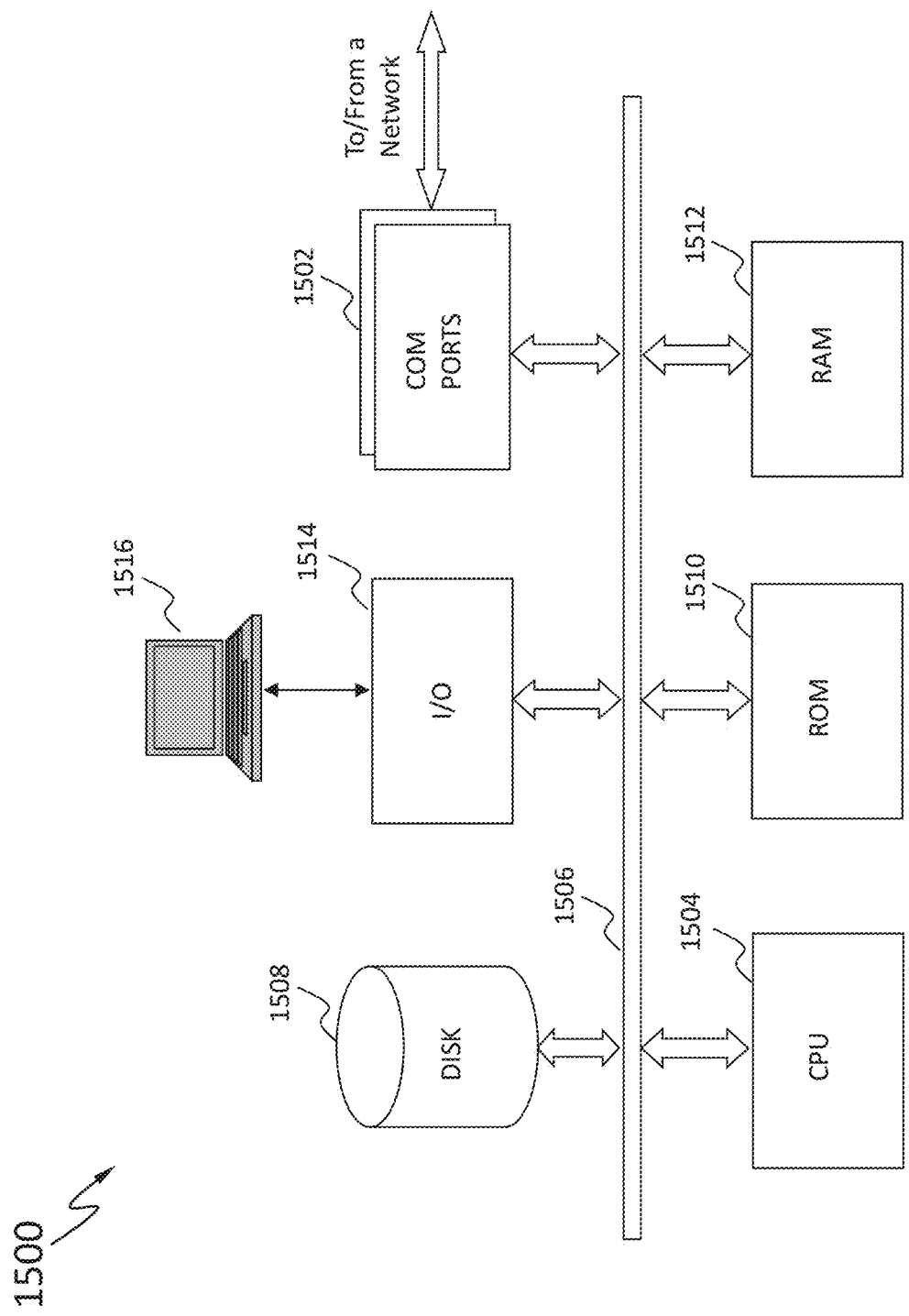
FIG. 15 depicts a general computer architecture on which the present teaching can be implemented.

When performing BIST, in an embodiment, the signal generator 270, the signal adjuster(s) 260, and the signal checker 240 may be in communication with a control terminal (not shown). In an embodiment, the control terminal may be located at a location distant or remote from the receiver 200 but in communication with the receiver 200. In an embodiment, although not shown, the control terminal may be integrated in the receiver 200 and coupled to various components in the receiver 200. The control terminal may be disposed on or affixed to a support platform. Alternatively, the control terminal can be a computer (e.g., the computer 1400 as shown in FIG. 15), a mobile device (e.g., the mobile device 1500 as shown in FIG. 15), a handheld device, or a wearable device. For example, the control terminal may be a tablet, a portable digital assistant, or any other suitable devices. In an embodiment, the control terminal may send to the signal generator 270 instructions indicating which output port to turn on, when to output the test signal, etc. In an embodiment, the control terminal may send to the signal adjuster 260 instructions enabling an appropriate signal adjuster 260 to adjust the one or more parameters of the test signal provided by the signal generator 270. The one or more parameters may include, but are not limited to amplitude, bandwidth, jitter, noise level for the test signal. In an embodiment, the control terminal may send to the signal adjuster 260 instructions indicating when to turn on the signal checker 240, when to turn off the signal checker 240, etc. Further, the control terminal may be configured to determine whether one or more components selected from the group of the CDR component 230 and the one or more amplifiers (such as the TIA 210 and/or the LA 220) function properly. More details about performing the BIST will be described in great detail associated with FIGS. 7-13.

In an embodiment, the signal generator 270 and/or the signal checker 240 may be configured to couple with external testing equipment configured to monitor the signal generator 270 and/or the signal checker 240. For example, the signal generator 270 may be configured to couple with an external signal checker configured to receive the test signal provided by the signal generator 270 and determine whether the signal generator 270 functions properly based on the received test signal from the signal generator 270. For example, the signal checker 240 may be configured to couple with an external signal generator configured to provide a known signal, e.g., a test bit sequence regardless of whether it is a pseudorandom bit sequence, to the signal checker 240. The signal checker 240 may be further determined so as to whether it functions properly based on the known signal provided by the external signal generator and the measure, e.g., the number of error bits, determined by the signal checker 240.

Figure 3:
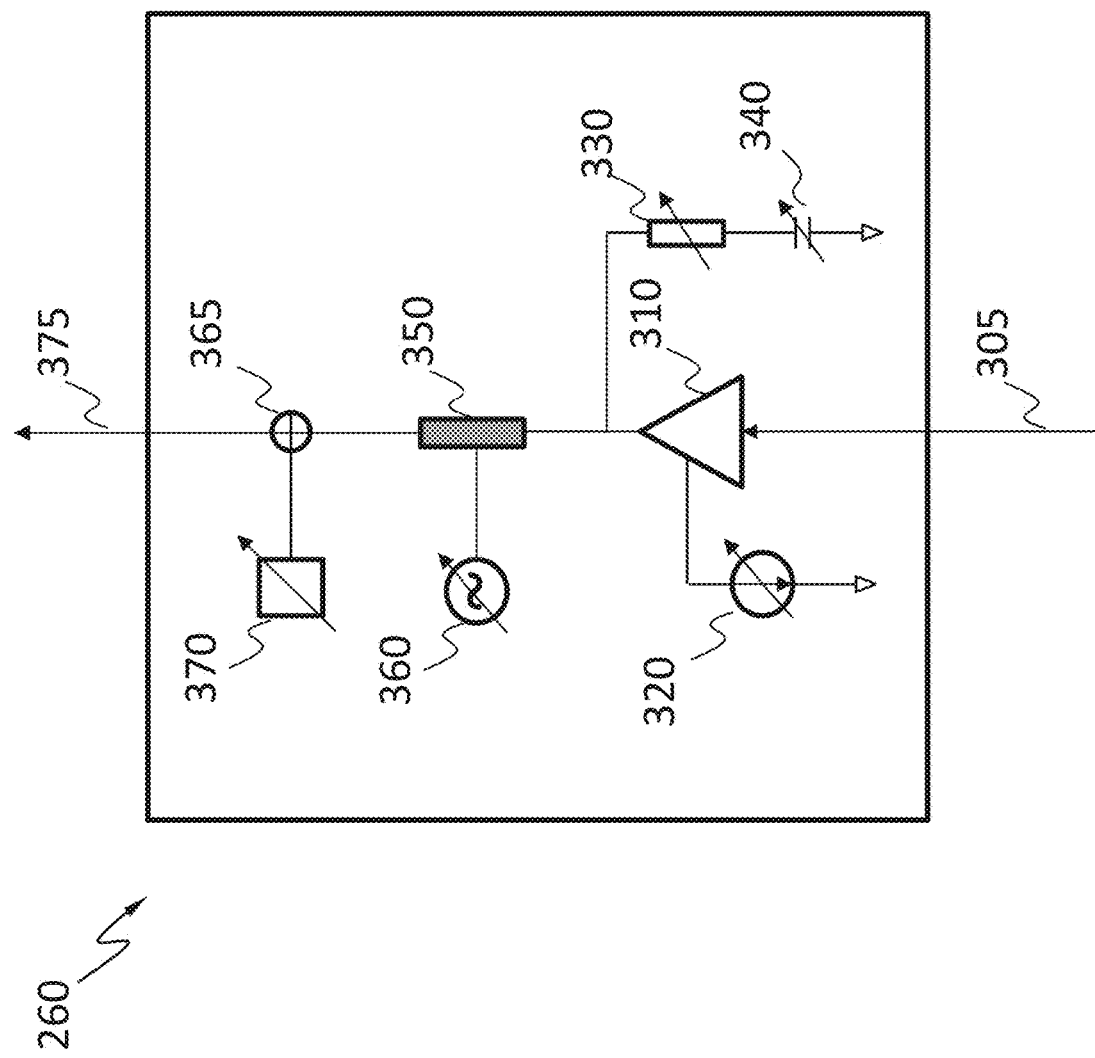
FIG. 3 is a schematic diagram of a signal adjuster in a receiver, according to an embodiment of the present teaching.

FIG. 3 is a schematic diagram of the signal adjuster 260 as shown in FIG. 2, according to an embodiment of the present teaching. The signal adjuster 260 may be configured to adjust one or more parameters of the test signal 305 received by the signal adjuster 260. The one or more parameters may include, but are not limited to, amplitude, bandwidth, jitter, and noise level. The signal adjuster 260 may be further configured to output the adjusted test signal 375. As shown, the signal adjuster 260 includes an amplifier 310, a tunable current source 320 coupled to the amplifier 310, a tunable resistor 330 coupled to the amplifier 310, a tunable capacitor 340 coupled to the tunable resistor 330, a delay line 350 coupled to the amplifier 310, a tunable RF source 360 coupled to the delay line 350, a tunable noise source 370, and a combiner 365 coupled to both the tunable noise source 370 and the delay line 350. The components may be arranged as shown or in any other suitable manner.

The amplifier 310 may be configured to receive a test signal 305, for example, the test signal provided by the signal generator 270 in FIG. 2. The amplifier 310 may be further configured to amplify the received test signal 305. For example, the amplifier 310 may be a TIA, a voltage buffer amplifier, a current mode logic (CML) buffer amplifier, or any other suitable amplifier. The tunable current source 320 may be configured to provide a tunable electric current within a predetermined range. By coupling the amplifier 310 to the tunable current source 320, the gain of the amplifier 310 may be adjusted by tuning the current output of the tunable current source 320. In an embodiment, the tunable current source 320 may be adjusted or tuned according to the control terminal as described in FIG. 2.

The tunable resistor 330 may be configured to provide tunable resistance. The tunable capacitor 340 is grounded and coupled to the tunable resistor 330. The tunable capacitor 340 may be configured to provide tunable capacitance. In an embodiment, the tunable resistor 330 and the tunable capacitor 340 may be collectively configured as a low pass filter whose cut off frequency is inversely proportional to the product of the resistance and the capacitance. Thus, the bandwidth of the test signal may be decreased when the cut off frequency decreases significant by increasing the resistance of the tunable resistor 330, the capacitance of the tunable capacitor 340, or both. In an embodiment, the tunable resistor 330 and the tunable capacitor 340 may be adjusted or tuned according to the control terminal as described in FIG. 2.

The delay line 350 may be configured to shift the test signal with respect to time. In an embodiment, the amount of shift with respect to time is proportional to the RF signal applied on the delay line 350. The tunable RF source 360 may be configured to provide sinusoidal RF signals with tunable power and tunable frequency. Therefore, by coupling the tunable RF source 360 to the delay line 350, jitter (specifically, time jitter) is produced for the test signal which passes through the delay line 350. In an embodiment, the maximal shift of the test signal with respect to time, in either direction of time, may be determined by the maximal output power of the tunable RF source 360. Further, the frequency of the shift with respect to time may be determined by the operating frequency of the tunable RF source 360, i.e., the frequency of the RF signal provided by the tunable RF source 360. In an embodiment, the output power and/or the operating frequency of the tunable RF source 360 may be tuned to adjust the jitter according to the control terminal as described in FIG. 2.

The tunable noise source 370 may be configured to provide tunable noise levels applied to the test signal 305 through the combiner 365. In an embodiment, the noise provided by the tunable noise source 370 may be directly added to the test signal inputted to the combiner 365. In an embodiment, the tunable noise source 370 may be tuned or adjusted according to the control terminal as described in FIG. 2. Finally, the adjusted test signal 375 may be outputted, for example, to the TIA 210, the LA 220, or the CDR component 230 in FIG. 2.

FIG. 4A illustrates an exemplary test signal, e.g., the test signal provided directly by the signal generator 270 in FIG. 2. As in this example, the test signal is illustrated as a waveform representing an 8-bit binary bit sequence of "01000100." The horizontal axis represents time, and the vertical axis represents amplitude (for example, current amplitude or voltage amplitude). As shown in this example, each portion of the waveform representing the bit of "0" corresponds to low current amplitude, and each portion of the waveform representing the bit of "1" corresponds to high current amplitude. It should be noted that this depiction is for illustrating purpose only and is not intended to be limiting. One of skill in the art would appreciate that any other suitable test signal may be provided.

FIGS. 4B-4E illustrate various test signals, in form of waveforms, with adjustable parameter such as amplitude, bandwidth, jitter, and noise level, according to an embodiment of the present teaching. Specifically, FIG. 4B illustrates a waveform with adjustable current amplitude within a range between a minimal current amplitude $I_{min}$ and a maximal current amplitude $I_{max}$. This may be done by tuning the tunable current source 320 in FIG. 3. The minimal current amplitude $I_{min}$ and the maximal current amplitude $I_{max}$ may be obtained when a minimal current and a maximal current are provided by the tunable current source 320, respectively.

FIG. 4C illustrates a waveform with adjustable bandwidth. With a reduced bandwidth, as shown, the waveform of the test signal is distorted due to the reduced number of frequency components of the test signal. This can be achieved by tuning the tunable resistor 330, the tunable capacitor 340, or both, in FIG. 3. Specifically, this can be achieved by increasing the resistance of the tunable resistor 330, the capacitance of the tunable capacitor 340, or both.

FIG. 4D illustrates a waveform with adjustable jitter. As shown, the waveform shifts in time within a range between $-\Delta t_{max}$ and $+\Delta t_{max}$, with reference to the waveform in FIG. 4A, producing jitter for the test signal. The maximal shift in time, of the waveform, $\Delta t_{max}$, is determined by the maximal output power of the tunable RF source 360 coupled to the delay line 350 in FIG. 3. Further, the frequency of the shift with respect to time is determined by the operating frequency of the tunable RF source 360 (i.e., the frequency of the RF signal provided by the tunable RF source 360). Therefore, the jitter may be adjusted by tuning the output power and/or the operating frequency of the tunable RF source 360.

FIG. 4E illustrates a waveform with adjustable noise level applied to the test signal. This may be achieved by tuning the output power of the tunable noise source 370 in FIG. 3. As can be seen, the test signal may be degraded significantly with a great noise level applied by the tunable noise source 370.

Figure 5:
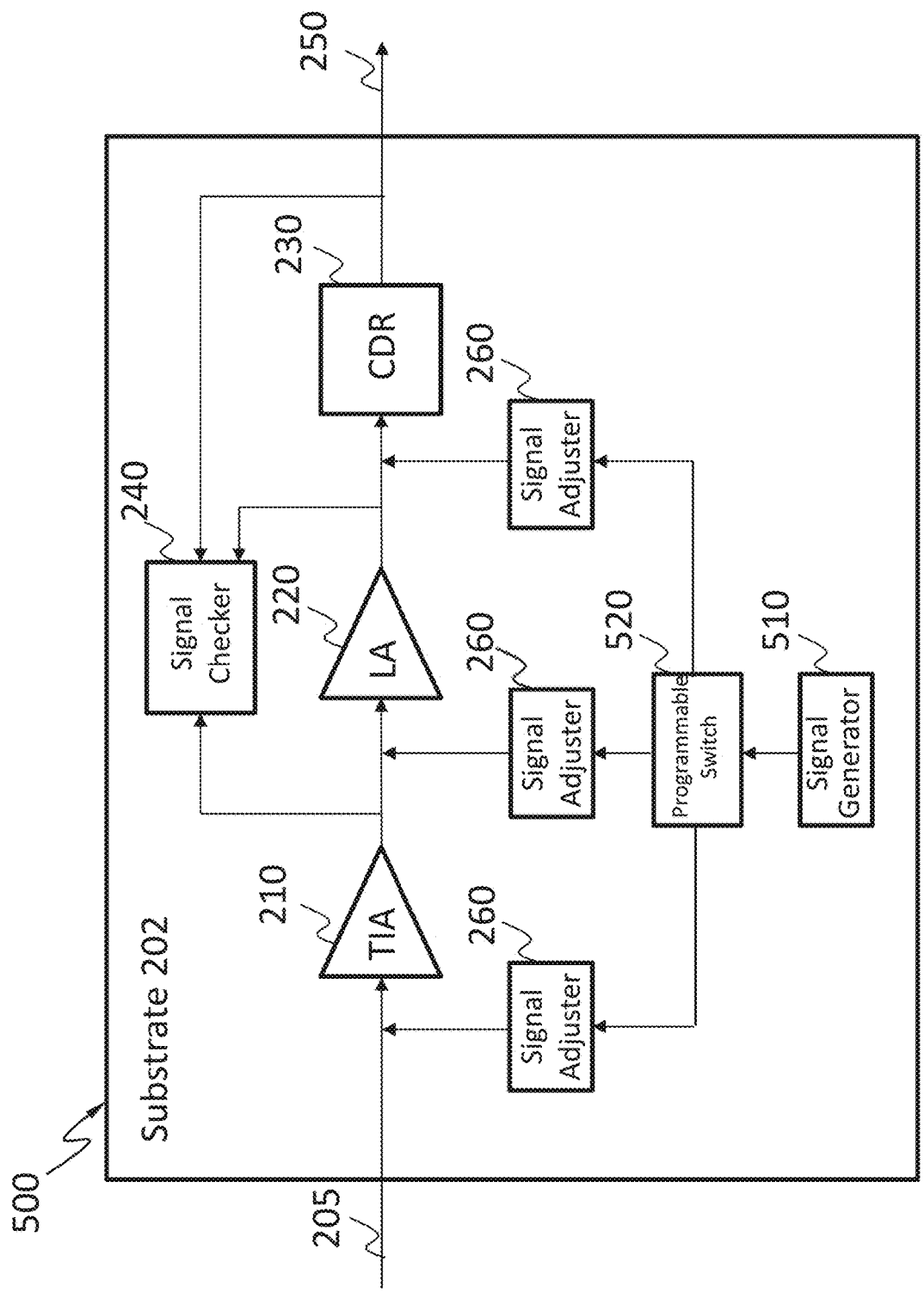
FIG. 5 is a schematic diagram of a receiver capable for BIST, according to an embodiment of the present teaching.

FIG. 5 is a schematic diagram of a receiver 500 capable for BIST, according to an embodiment of the present teaching. The receiver 500 may be any one of the receivers $190_{1-n}$ in the receiver chip 115. The receiver 500 may be similar to the receiver 200 except that the signal generator 510 may have only one output port while the signal generator 270 in FIG. 2 may have multiple output ports. Further, the receiver 500 includes a programmable switch 520 on the substrate 202 and coupled to the signal generator 270. In an embodiment, the substrate 202 is a silicon substrate. The programmable switch 520 may be further coupled to at least two components selected from a group consisting of the one or more amplifier (such as the TIA 210 and the LA 220) through the corresponding signal adjusters 260. The programmable switch 520 may be configured to selectively direct the test signal provided by the signal generator 270 to one component selected from the at least two components as described above. In an embodiment, the programmable switch 510 may be controlled by the control terminal as described above.

Figure 6:
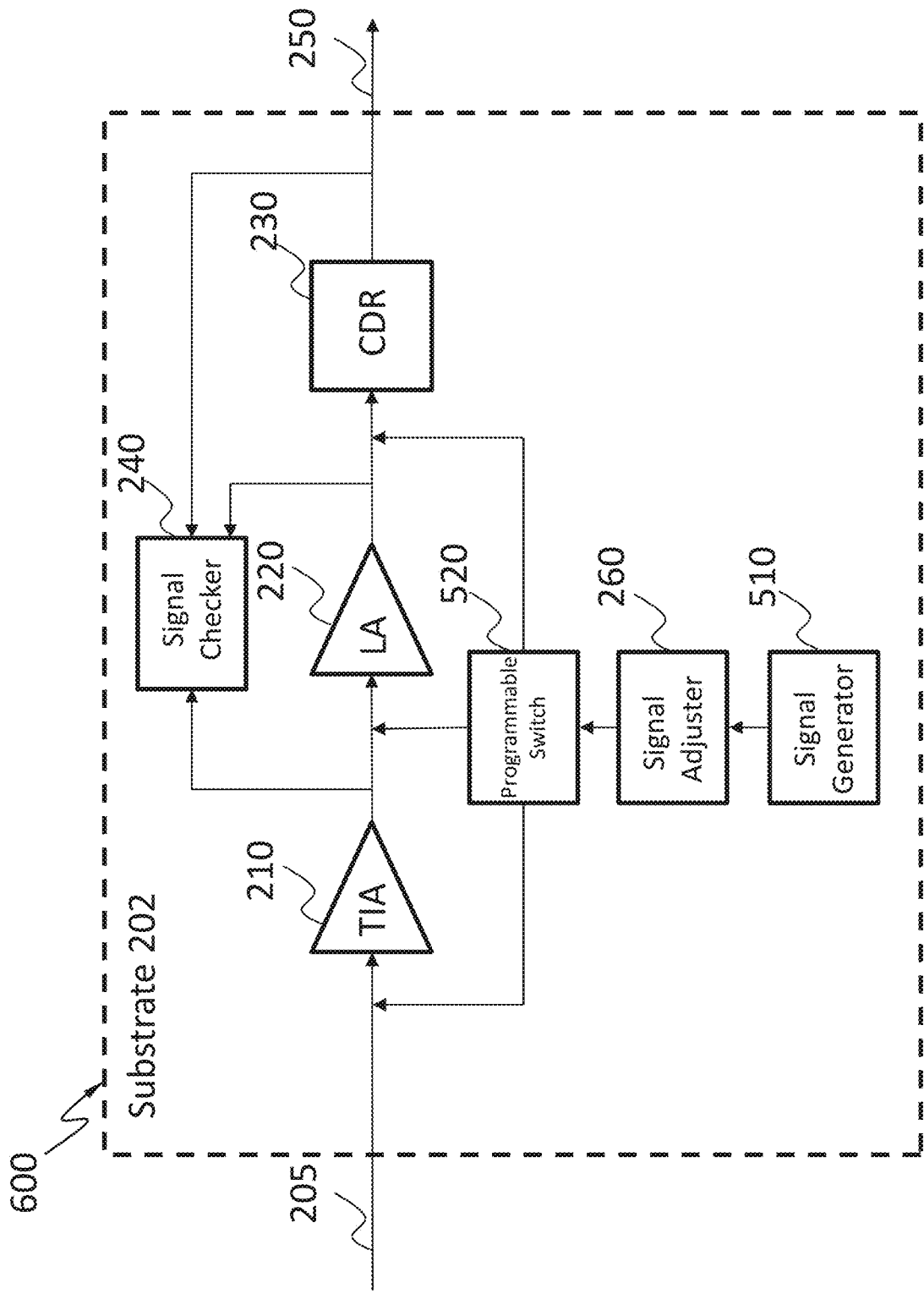
FIG. 6 is a schematic diagram of a receiver capable for BIST, according to an embodiment of the present teaching.

FIG. 6 is a schematic diagram of a receiver 600 capable for BIST, according to an embodiment of the present teaching. The receiver 600 may be any one of the receivers 190l-n in the receiver chip 115. As shown, the programmable switch 520 is coupled to the signal adjuster 260. The programmable switch 520 may be further coupled to at least two components selected from the group consisting of the CDR component 230 and the one or more amplifiers such as the TIA 210 and the LA 220. In this example, the programmable switch 520 is coupled to all of the CDR component 230, the TIA 210, and the LA 220. The programmable switch 510 may be configured to selectively direct the test signal after adjusted by the signal adjuster 260 to one component selected from the at least two components as described above. In an embodiment, the programmable switch 510 may be controlled by the control terminal as described above.

Figure 7:
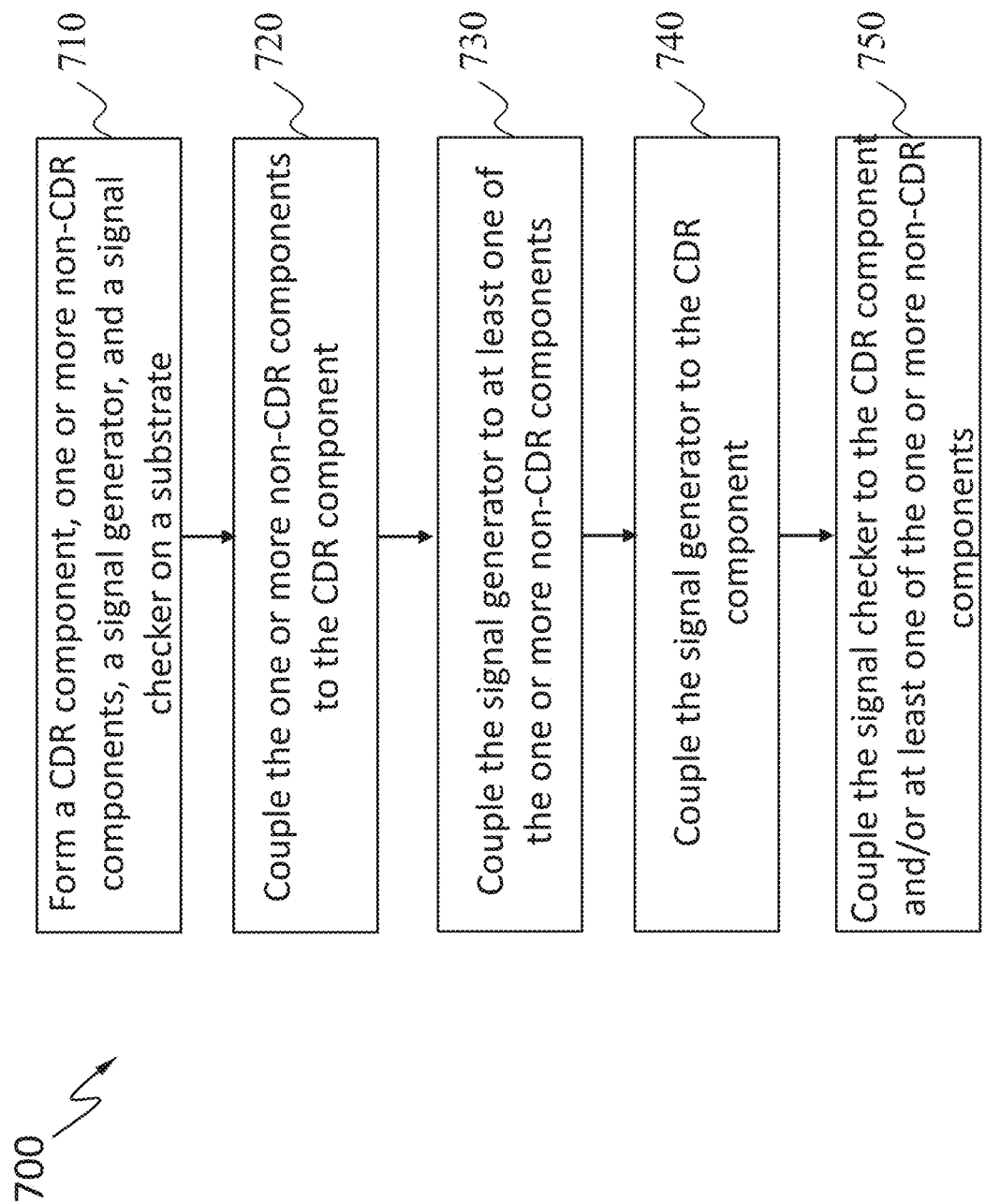
FIG. 7 is a flowchart of an exemplary process for manufacturing a receiver capable for BIST, according to an embodiment of the present teaching.

FIG. 7 is a flowchart of an exemplary process 700 for manufacturing the receivers 200, 500, and 600, according to an embodiment of the present teaching. Aspects of the process 700 may be performed by one or more processing tools. In an embodiment, the process 700 may be implemented using a standard complementary metal-oxide-semiconductor (CMOS) technology.

A step 710, a CDR component, one or more non-CDR components, a signal generator, and a signal checker are formed on a substrate. The CDR component, the signal generator, and the signal checker may be similar to the CDR component 230, the signal generator 270, and the signal checker 240, respectively. The one or more non-CDR components may include one or more amplifiers, such as the TIA 210 and the LA 220. In an embodiment, the substrate is a silicon substrate.

At step 720, the one or more non-CDR components are coupled to the CDR components. At step 730, the signal generator is coupled to at least one of the one or more non-CDR components. In an embodiment, the signal generator may be coupled to the one or more amplifiers, such as a TIA, a LA, or both. At step 740, the signal generator is coupled to the CDR component. At step 750, the signal checker is coupled to the CDR component and/or at least one of the one or more non-CDR components. In an embodiment, the signal checker may be coupled to the CDR component, the TIA, the LA, or any combination thereof.

Figure 8:
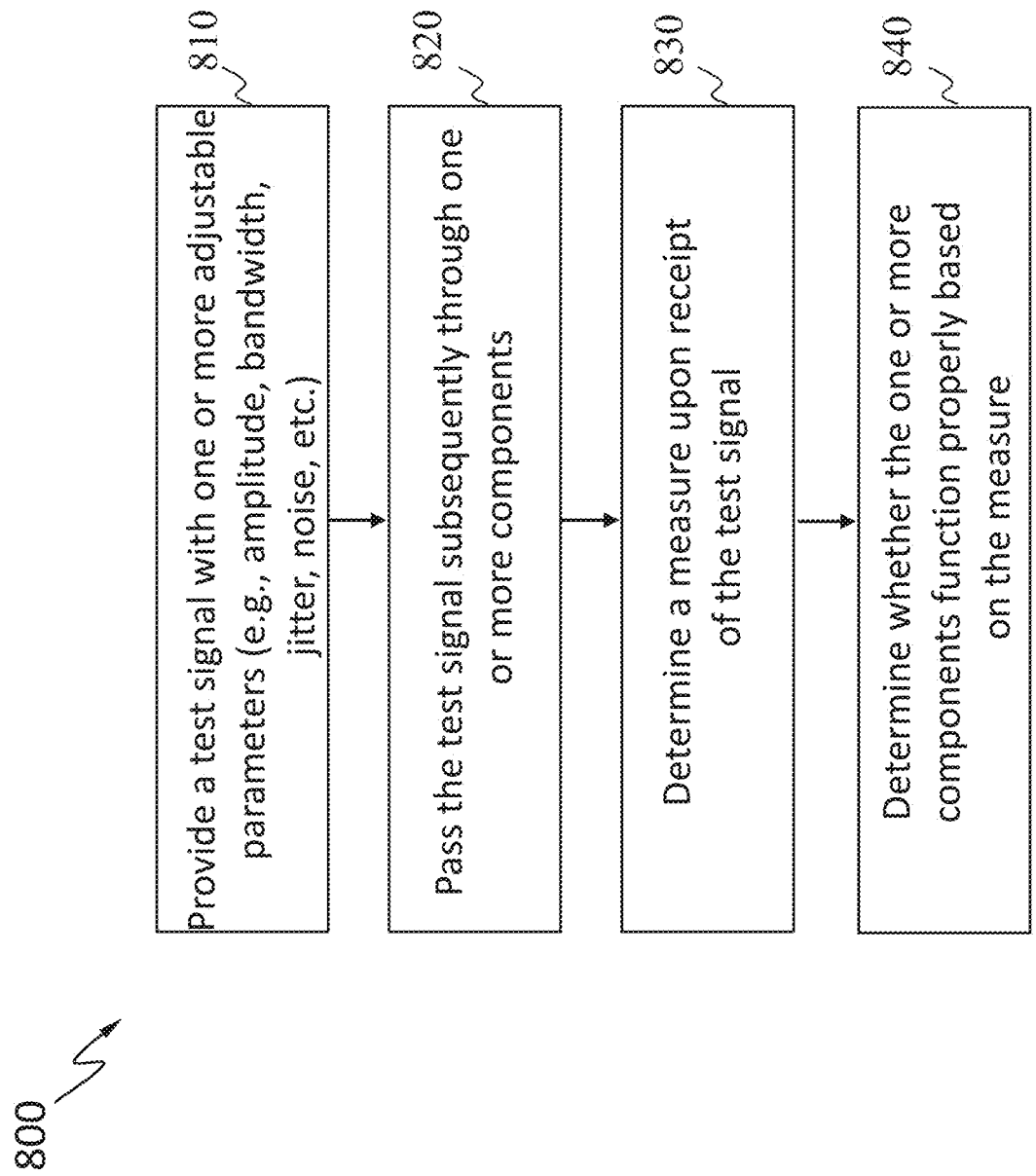
FIG. 8 is a flowchart of an exemplary process for performing BIST, according to an embodiment of the present teaching.

Various methods may be used to perform BIST, for example, for determining whether one or more components in a receiver function properly. FIG. 8 is a flowchart of an exemplary process 800 for performing BIST, according to an embodiment of the present teaching. At step 810, a test signal is provided with one or more adjustable parameters. The one or more adjustable parameters may include, but are not limited to, amplitude, bandwidth, jitter, and noise. In an embodiment, the one or more adjustable parameters may be adjusted by tuning at least one component selected from a group consisting of a tunable resistor, a tunable capacitor, a tunable noise source, a tunable RF source coupled to a delay line, and a tunable current source as described associated with FIG. 3. In an embodiment, the test signal is a pseudorandom bit sequence.

At step 820, the test signal (for example, after adjusted) is passed subsequently through one or more components selected from a group consisting of a CDR component, a TIA, and a LA. In an embodiment, the one or more components include one or more non-CDR components, such as the TIA or the LA. In an embodiment, the one or more components may further include a CDR component. For example, the test signal may be passed only through the TIA 210 in FIG. 2.

At step 830, a measure is determined upon receipt of the test signal. In an embodiment, the measure is indicative of a number of error bits received out of the pseudorandom bit sequence. At step 840, it is determined whether the one or more components function properly based on the measure. In an embodiment, a characteristic is determined based on the measure determined at step 830. For example, the characteristic may refer to the bit error rate, while the measure refers to the number of error bits received out of the pseudorandom bits provided by the signal generator. As such, the characteristic may be determined as a radio of the measure to the number of bits (for example, pseudo-random bits) provided by the signal generator. Then, the characteristic is compared with a threshold. For example, when the characteristic is within the threshold, it is determined that the one or more components (e.g., the TIA 210) function properly. Then, in some examples, a new BIST of another component or another group of components may be performed. In some other examples, the receiver may be ready to be sold to customers. Alternatively, when the characteristic is above the threshold, it is determined that the one or more components (e.g., the TIA 210) function improperly. Then, the receiver may be reworked, recycled, or discarded.

Figure 9:
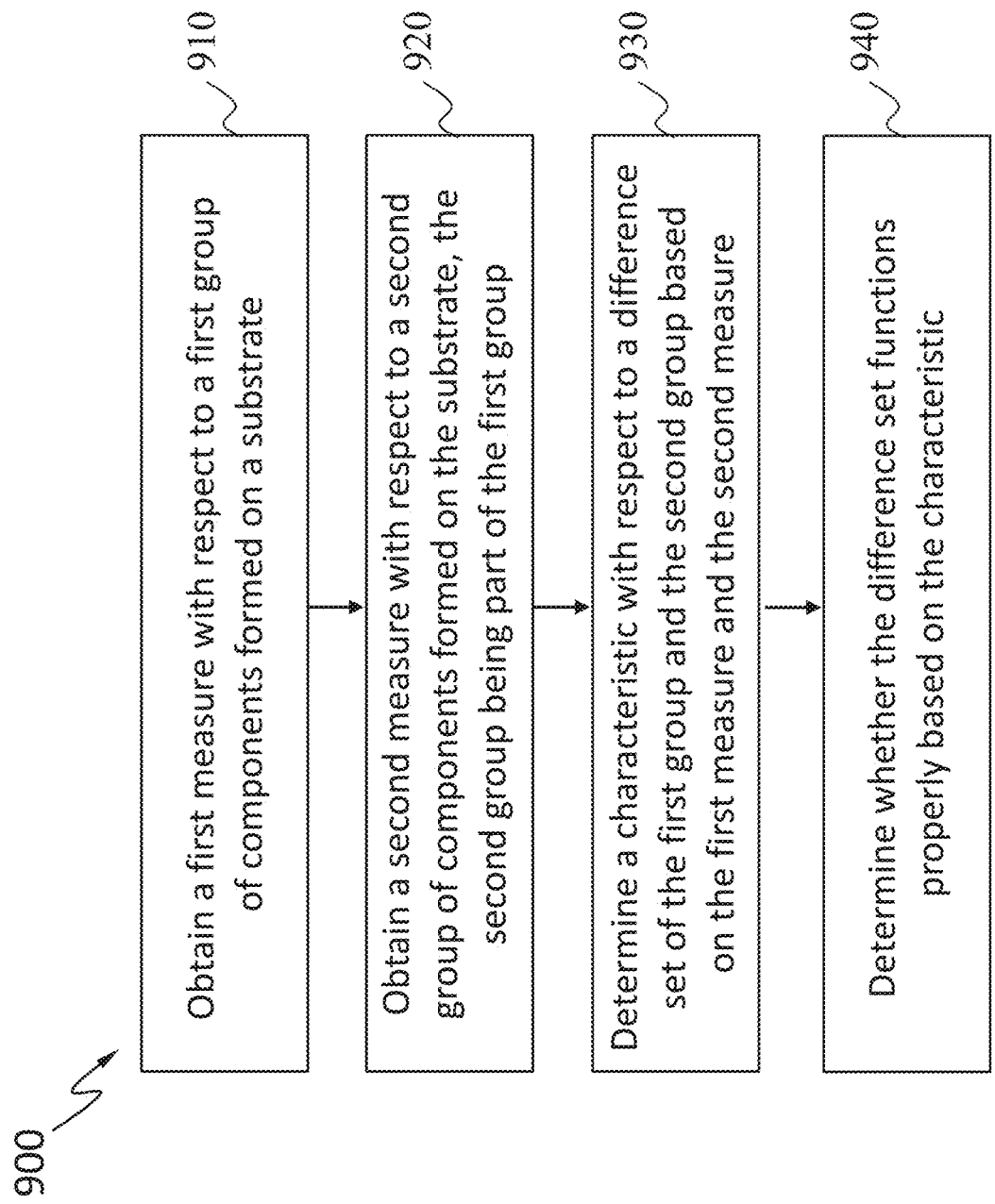
FIG. 9 is a flowchart of an exemplary process for performing BIST, according to an embodiment of the present teaching.

FIG. 9 is a flowchart of another exemplary process 900 for performing BIST, according to an embodiment of the present teaching. At step 910, a first measure with respect to a first group of components on a substrate is obtained. In an embodiment, the substrate is a silicon substrate. In an embodiment, the first measure may be determined by the signal checker upon receipt of a first test signal after the first test signal passes through the first group of components, for example, consisting of the TIA 210, the LA 220, and the CDR component 230 in FIG. 2.

At step 920, a second measure with respect to a second group of components on the substrate is obtained. The second group is part of the first group. The second measure may be determined by the signal checker upon receipt of a second test signal after the second test signal passes through the second group of components, for example, consisting of the LA 220 and the CDR component 230. In an embodiment, the first measure and the second measure may be determined in a single test with the same test signal provided by the signal generator. In an embodiment, the first measure and the second measure may be determined in separate tests with the same test signal or different test signals provided by the signal generator.

At step 930, a characteristic with respect to a difference set of the first group and the second group is determined based on the first measure and the second measure. In an embodiment, the characteristic may refer to the bit error rate with respect to the difference set of the first group and the second group. Thus, the characteristic with respect to the difference set may be determined as follows. For example, a first bit error rate may be determined as a ratio of the first measure to the number of bits included in the first test signal that passes through the first group of components. A second bit error rate may be determined as a ratio of the second measure to the number of bits included in the second test signal which passes through the second group of components. Finally, the characteristic with respect to the difference set may be determined as a difference between the first bit error rate and the second bit error rate. In the example above, the first group may consist of the TIA 210, the LA 220, and the CDR component 230 in FIG. 2. The second group may consist of the LA 220 and the CDR component 230 in FIG. 2. Therefore, the difference set of the first group and the second group may consist of the TIA 210. Thus, the characteristic (e.g., the bit error rate) with respect to the TIA 210 may be determined based on the first measure (e.g., the first number of error bits received by the signal checker 240 after the first test signal passes through the first group consisting of the TIA 210, the LA 220, and the CDR component 230) and the second measure (e.g., the second number of error bits received by the signal checker 240 after the second test signal passes through the second group consisting of the LA 220 and the CDR component 230) as described above.

In some instances, the characteristic (e.g., the bit error rate) with respect to the difference set of the first group and the second group (e.g., the TIA 210 in this example) may be determined based on the difference between the first measure and the second measure. For example, when the first test signal has a same number of bits as the second test signal (regardless of whether the first test signal is the same as the second test signal), the characteristic may be determined as a ratio of a difference between the first measure and the second measure to the number of bits included in the first test signal or the second test signal.

At step 940, it is determined whether the difference set functions properly based on the characteristic. For example, it is determined that the difference set (e.g., the TIA 210 in this example) functions properly when the characteristic is within a threshold. Then, in some examples, a new BIST of another component or another group of components may be performed. In some other examples, the receiver may be ready to be sold to customers. Alternatively, it is determined that the difference set (e.g., the TIA 210 in this example) functions improperly when the characteristic is greater than the threshold. Then, the receiver may be reworked, recycled, or discarded.

As described above, the test signal may have one or more adjustable parameters. In some instances, it may be desirable to perform BIST for evaluating the performance of one or more components with different values of the one or more parameters for the test signal. It may also be desirable to perform BIST for determining a minimal or maximal value (i.e., sensitivity) of one or more parameters that allow for proper operation.

Figure 10:
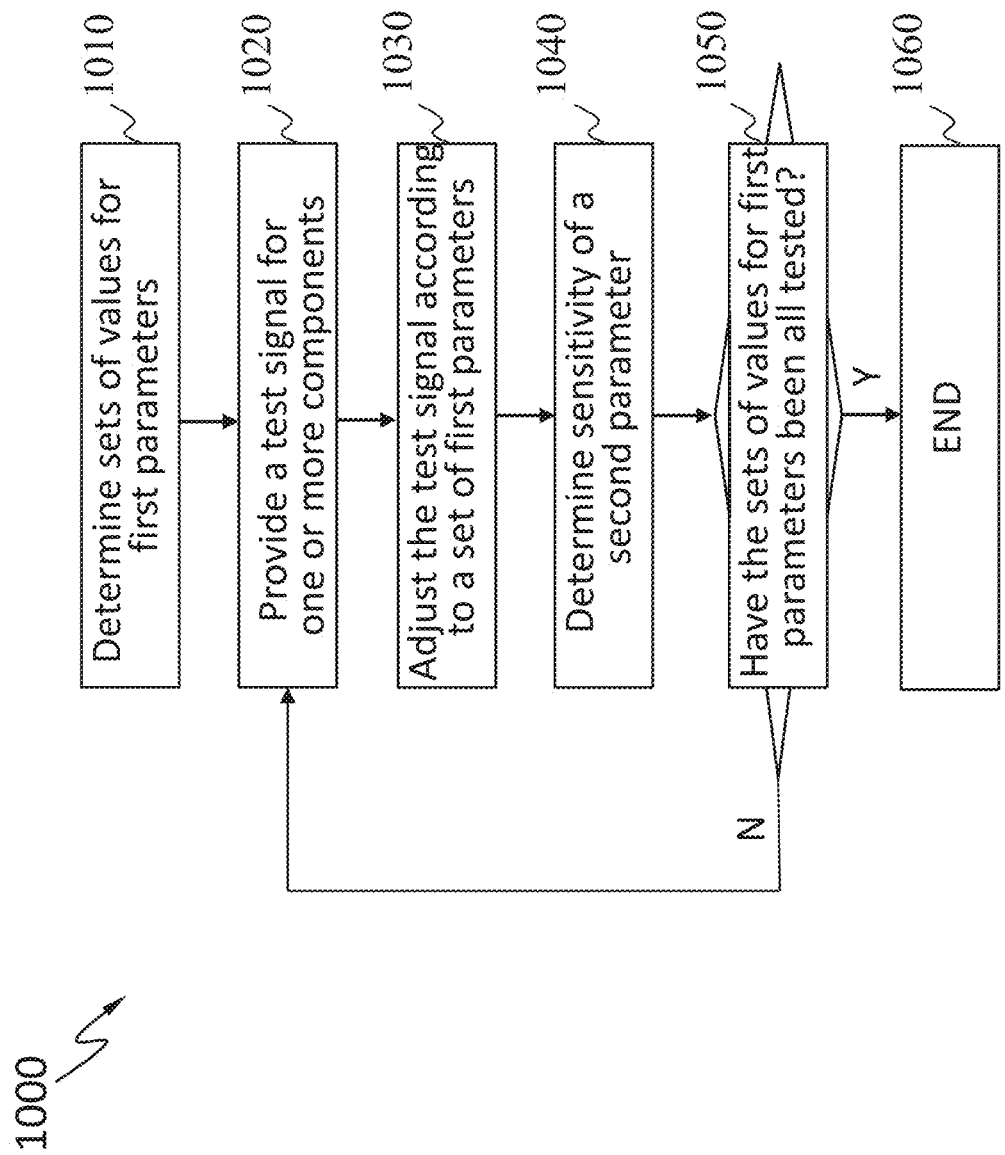
FIG. 10 is a flowchart of an exemplary process for performing BIST, according to an embodiment of the present teaching.

FIG. 10 is a flowchart of an exemplary process 1000 for performing BIST, according to an embodiment of the present teaching. At step 1010, a plurality of sets of values for first parameters is determined (for example, for a test signal to be provided by a signal generator). The first parameters may include, but are not limited to, amplitude, bandwidth, jitter, and noise level. At step 1020, the test signal is provided to pass through one or more components, for example, selected from a group consisting of a CDR component and one or more amplifiers such as the TIA and the LA. At step 1030, the test signal is adjusted according to a set of first parameters. As described above, the test signal may be adjusted by a signal adjuster, specifically, by tuning one or more components selected from a group consisting of a tunable resistor, a tunable capacitor, a tunable noise source, a tunable RF source coupled to a delay line, and a tunable current source in the signal adjuster as described associated with FIG. 3.

Figure 11:
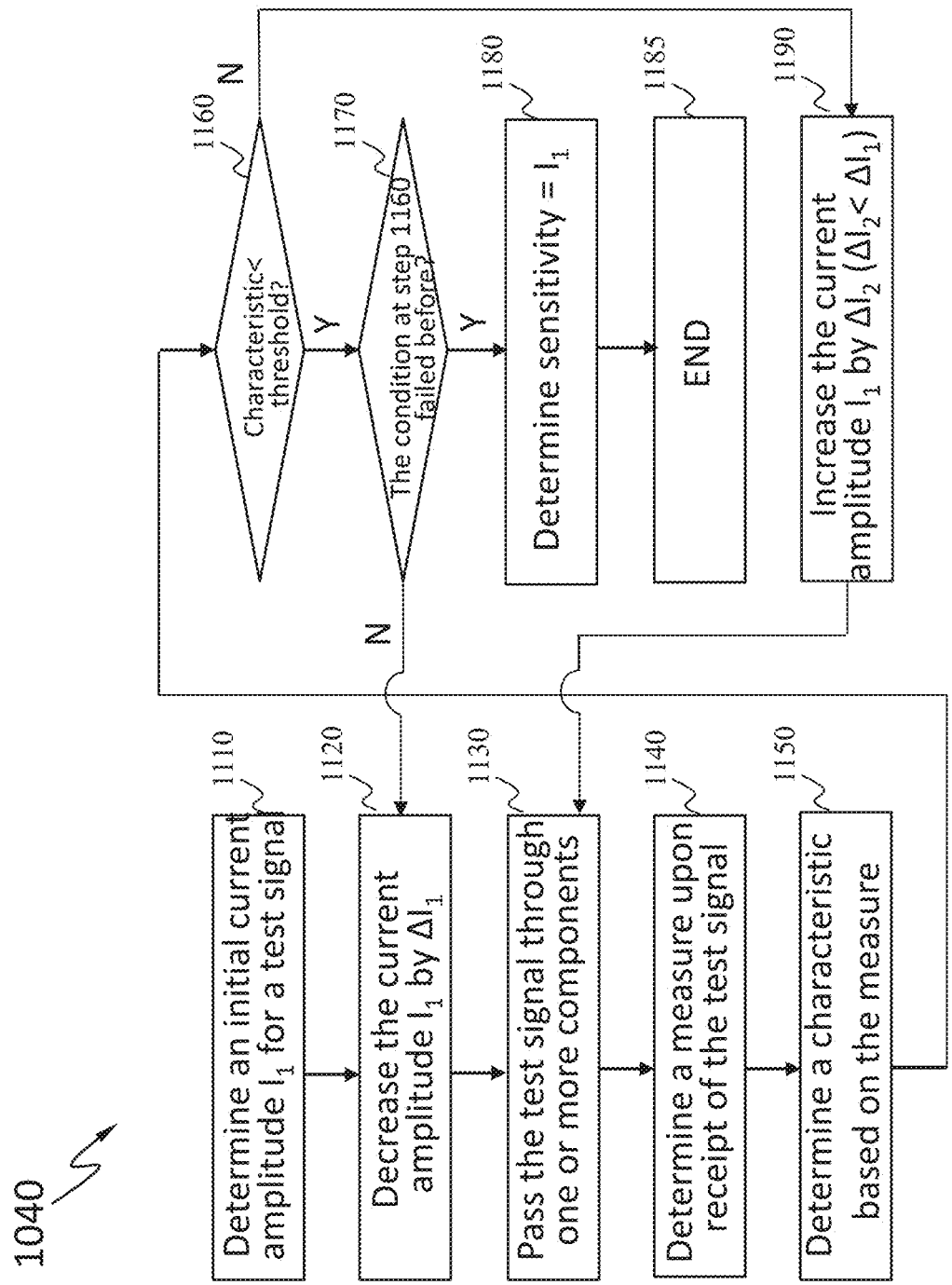
FIG. 11 is a flowchart of an exemplary process for performing step 1040 in FIG. 10 using a linear searching method, according to an embodiment of the present teaching.
Figure 12:
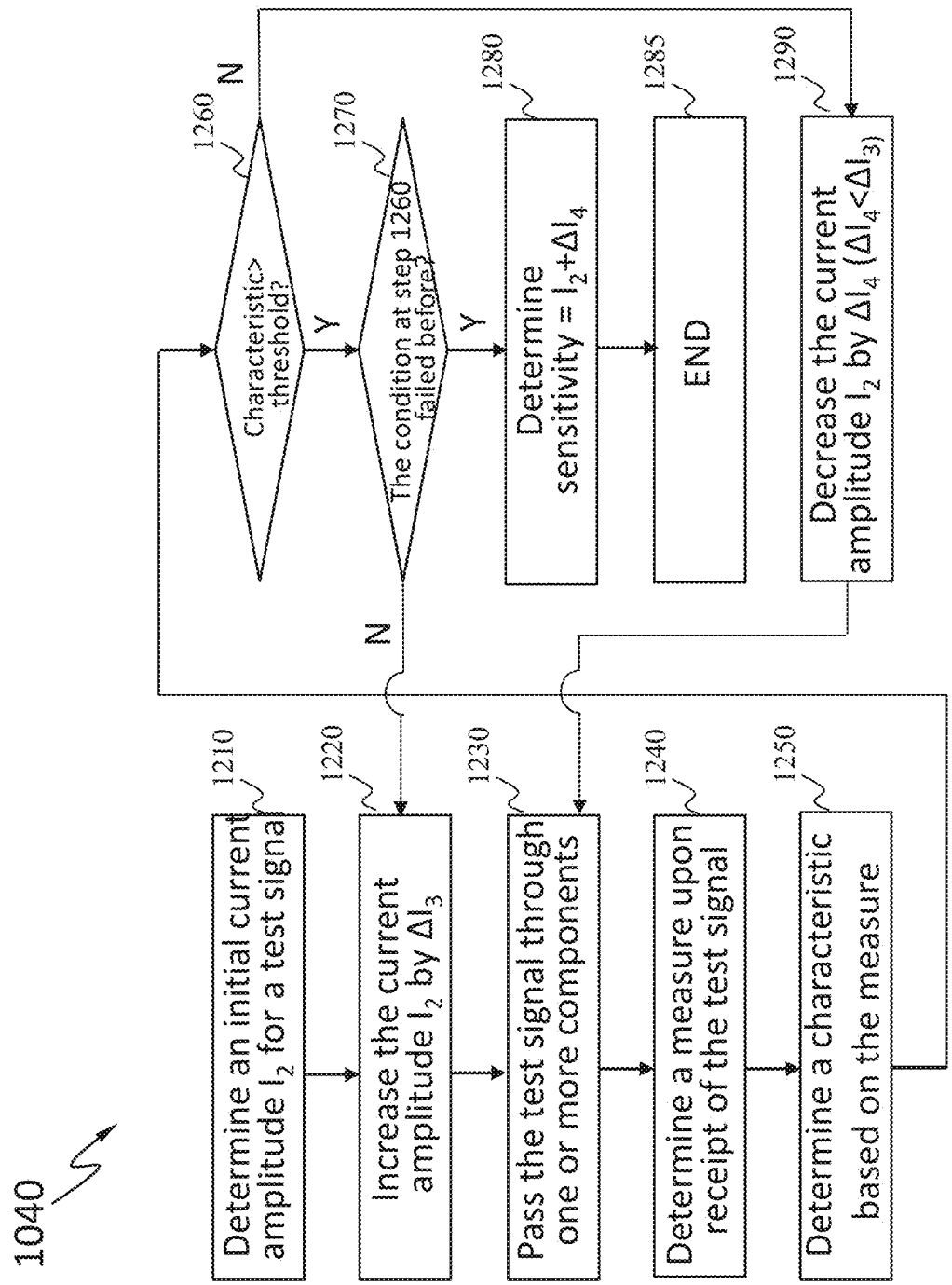
FIG. 12 is a flowchart of an exemplary process for performing step 1040 in FIG. 10 using a linear searching method, according to an embodiment of the present teaching.

At step 1040, sensitivity of a second parameter is determined. The second parameter may be selected from the group consisting of amplitude, bandwidth, jitter, and noise level. The second parameter may be, or may not be, one of the first parameters. In an embodiment, the sensitivity of the second parameter is indicative of a minimal value or a maximal value of the second parameter, given the set of first parameters excluding the second parameter, which allows the one or more components that the test signal passes through function properly. The sensitivity of the second parameter may be determined using either a linear searching method as illustrated in FIGS. 10-11 or a binary searching method as illustrated in FIG. 12. In FIGS. 10-12, the amplitude (specifically, the current amplitude of the test signal) is identified as the second parameter. This is for illustrating purpose only and is not intended to be limiting. One of skill in the art would appreciate that any of the adjustable parameters as we described herein may be selected as the second parameter. At step 1050, it is determined whether the plurality of sets of values for the first parameters has been all tested. If so, the process 1000 is finished at step 1060. Otherwise, the process 1000 returns to step 1020.

FIG. 11 is a flowchart of an exemplary process for performing step 1040 in FIG. 10 using a linear searching method, according to an embodiment of the present teaching. At step 1110, an initial current amplitude $I_1$ is determined for the test signal. In an embodiment, the initial current amplitude $I_1$ is large enough to allow the condition in step 1160 to be satisfied. At step 1120, the current amplitude $I_1$ is decreased by $\Delta I_1$.

At step 1130, the test signal is passed through one or more components, for example selected from a group consisting of the TIA, the LA, and the CDR component. In an embodiment, the test signal is a pseudorandom bit sequence provided by the signal generator. At step 1140, a measure is determined upon receipt of the test signal, for example, by the signal checker. In an embodiment, the measure is indicative of a number of error bits received by the signal checker out of the test signal provided by the signal generator. At step 1150, a characteristic is determined based on the measure. In an embodiment, the characteristic may be the bit error rate determined based on the measure as described above.

At step 1160, it is determined whether the characteristic is within a threshold. If so, the process progresses to step 1170. Otherwise, the process progresses to step 1190. At step 1170, it is determined whether the condition at step 1160 has failed before. If so, the process progresses to step 1180. Otherwise, the process returns to step 1120.

At step 1180, the sensitivity of the current amplitude is determined to be equal to the current amplitude $I_1$. Then the process is finished at step 1185. At step 1190, the current amplitude $I_1$ is increased by $\Delta I_2$ ($\Delta I_2 < \Delta I_1$), after which the process returns to step 1130.

FIG. 12 is a flowchart of an exemplary process for performing step 1040 in FIG. 10 using another linear searching method, according to an embodiment of the present teaching. At step 1210, an initial current amplitude $I_2$ is determined for the test signal. In an embodiment, the initial current amplitude $I_2$ is small enough to allow the condition in step 1260 to be satisfied. At step 1220, the current amplitude $I_2$ is increased by $\Delta I_3$.

At step 1230, the test signal is passed through one or more components, for example selected from the group consisting of the TIA, the LA, and the CDR component. In an embodiment, the test signal is a pseudorandom bit sequence provided by the signal generator. At step 1240, a measure is determined upon receipt of the test signal, for example, by the signal checker. In an embodiment, the measure is indicative of a number of error bits received by the signal checker out of the test signal provided by the signal generator. At step 1250, a characteristic is determined based on the measure. In an embodiment, the characteristic may be the bit error rate determined based on the measure as described above.

At step 1260, it is determined whether the characteristic is greater than a threshold. If so, the process progresses to step 1270. Otherwise, the process progresses to step 1290. At step 1270, it is determined whether the condition at step 1260 has failed before. If so, the process progresses to step 1280. Otherwise, the process returns to step 1220.

At step 1280, the sensitivity of the current amplitude is determined to be equal to the current amplitude $I_2$ increased by $\Delta I_4$ ($\Delta I_4 < \Delta I_3$). Then the process is finished at step 1285. At step 1290, the current amplitude $I_2$ is decreased by $\Delta I_4$, after which the process returns to step 1230.

Figure 13:
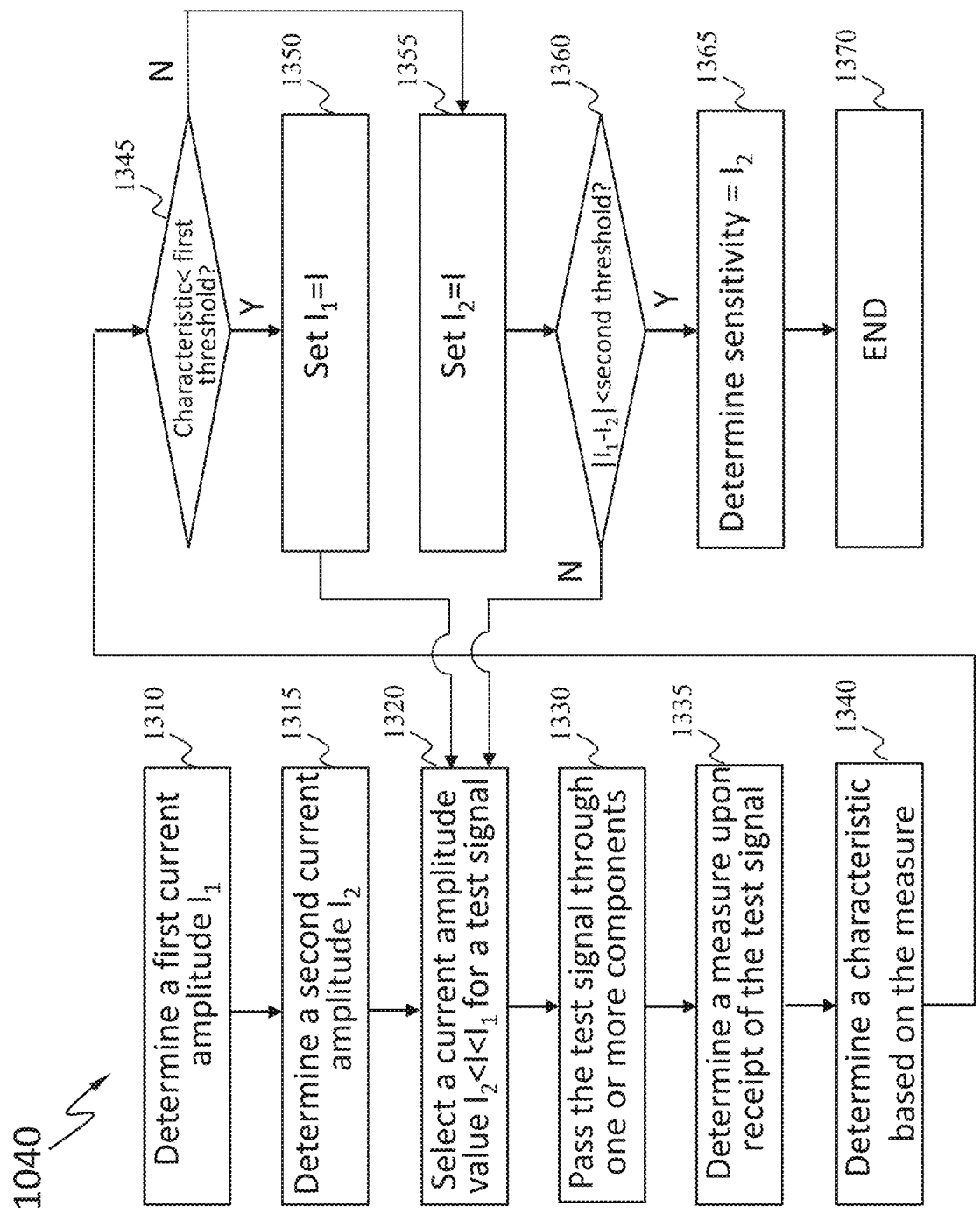
FIG. 13 is a flowchart of an exemplary process for performing step 1040 in FIG. 10 using a binary searching method, according to an embodiment of the present teaching.

FIG. 13 is a flowchart of an exemplary process for performing step 1040 in FIG. 10 using a binary searching method, according to an embodiment of the present teaching. At step 1310, a first current amplitude $I_1$ is determined for the test signal. In an embodiment, the first current amplitude $I_1$ is large enough to allow the condition in step 1345 to be satisfied. At step 1315, a second current amplitude $I_2$ is determined for the test signal. In an embodiment, the second current amplitude $I_2$ is small enough to allow the condition in step 1345 to be failed. At step 1320, a current amplitude value I is selected between the first current amplitude $I_1$ and the second current amplitude $I_2$, for the test signal. In an embodiment, the current amplitude value I may be selected as the average of the current amplitude $I_1$ and the second current amplitude $I_2$.

At step 1330, the test signal is passed through one or more components, for example selected from a group consisting of the TIA, the LA, and the CDR component. In an embodiment, the test signal is a pseudorandom bit sequence provided by the signal generator. At step 1335, a measure is determined upon receipt of the test signal, for example, by the signal checker. In an embodiment, the measure is indicative of a number of error bits received by the signal checker out of the test signal provided by the signal generator. At step 1340, a characteristic is determined based on the measure. In an embodiment, the characteristic may be the bit error rate determined based on the measure as described above.

At step 1345, it is determined whether the characteristic is within a first threshold. The first threshold is sometimes referred to as an error count. If so, the process progresses to step 1350. Otherwise, the process progresses to step 1355. At step 1350, the value of the first current amplitude $I_1$ is set to be equal to the current amplitude I, after which the process returns to step 1320. At step 1355, the value of the second current amplitude $I_2$ is set to be equal to the value of the current amplitude I, after which the process progresses to step 1360.

At step 1360, it is determined whether the absolute value of a difference between the first current amplitude $I_1$ and the second current amplitude $I_2$ is below a second threshold. The second threshold is sometimes referred to as a resolution. If so, the process progresses to step 1365. Otherwise, the process returns to step 1320. At step 1365, the sensitivity of the current amplitude is determined to be equal to the second current amplitude $I_2$, after which the process is finished at step 1370.

In an embodiment, there is provided an apparatus comprising: one or more non-CDR components on a substrate; a signal generator on the substrate and coupled to at least one of the one or more non-CDR components; and a CDR component on the substrate and coupled to the one or more non-CDR components, wherein the CDR component is: configured to recover clock data from a received signal by the CDR component, and configured to determine a signal based on the received signal and the clock data.

In an embodiment, the one or more non-CDR components comprise one or more amplifiers. In an embodiment, the one or more amplifiers comprise a trans-impedance amplifier or a limiting amplifier.

In an embodiment, the signal generator is configured to provide a test signal for self-testing one or more components selected from a group consisting of the one or more non-CDR components and the CDR component.

In an embodiment, the apparatus further comprises a signal checker on the substrate and coupled to the CDR component or at least one of the one or more non-CDR components, wherein the signal checker is configured to determine a measure upon receipt of the test signal after the test signal passes through the one or more components selected from the group consisting of the one or more non-CDR components and the CDR component.

In an embodiment, the signal generator or the signal checker is configured to couple with an external device configured to monitor the signal generator or the signal checker. In an embodiment, the signal generator is a PRBS generator. In an embodiment, the measure is indicative of a number of error bits received by the signal checker.

In an embodiment, the apparatus further comprises a signal adjuster on the substrate and coupled to the signal generator, wherein the signal adjuster is configured to adjust one or more parameters of the test signal. In an embodiment, the one or more parameters of the test signal are selected from a group consisting of amplitude, bandwidth, jitter, and noise level.

In an embodiment, the signal adjuster comprises an amplifier coupled to a tunable current source, and wherein the amplifier and the tunable current source are collectively configured to adjust amplitude of the test signal, gain of the amplifier being adjustable through tuning the tunable current source.

In an embodiment, the signal adjuster comprises a tunable resistor or a tunable capacitor, and wherein the tunable resistor or the tunable capacitor is configured to adjust the bandwidth of the test signal.

In an embodiment, the signal adjuster comprises a delay line coupled to a tunable RF source, and wherein the delay line and the tunable RF source are collectively configured to adjust the jitter of the test signal.

In an embodiment, the tunable RF source is configured to provide sinusoidal RF signals with tunable frequency or tunable power. In an embodiment, the signal adjuster comprises a tunable noise source configured to adjust noise level applied to the test signal.

In an embodiment, the apparatus further comprises a programmable switch coupled to the signal adjuster and at least two components selected from a group consisting of the CDR component and the one or more non-CDR components.

In an embodiment, the programmable switch is configured to selectively direct the test signal to a component selected from a group consisting of the one or more non-CDR components and the CDR component. In an embodiment, the substrate is a silicon substrate.

In an embodiment, there is provided a method comprising: forming a signal generator, one or more non-CDR components, and a CDR component on a substrate, wherein the CDR component is: configured to recover clock data from a received signal by the CDR component, and configured to determine a signal based on the received signal and the clock data; coupling the CDR component to the one or more non-CDR components; and coupling the signal generator to at least one of the one or more non-CDR components.

In an embodiment, the method further comprises: forming a signal checker on the substrate; and coupling the signal checker to the CDR component or at least one of the one or more non-CDR components. In an embodiment, the method further comprises coupling the signal generator to the CDR component.

In an embodiment, the one or more non-CDR components comprise one or more amplifiers. In an embodiment, the one or more amplifiers comprise a trans-impedance amplifier or a limiting amplifier. In an embodiment, the substrate is a silicon substrate.

In an embodiment, there is provided a method of using an apparatus, the apparatus comprising: one or more non-CDR components on a substrate; a signal generator on the substrate and coupled to at least one of the one or more non-CDR components; and a CDR component on the substrate and coupled to the one or more non-CDR components, wherein the CDR component is: configured to recover clock data from a received signal by the CDR component, and configured to determine a signal based on the received signal and the clock data, and the method comprising providing, by the signal generator, a test signal with one or more adjustable parameters.

In an embodiment, the method further comprises: passing the test signal subsequently through one or more components selected from a group consisting of the one or more non-CDR components and the CDR component; determining a measure upon receipt of the test signal; and determining whether the one or more components function properly based on the measure.

In an embodiment, the one or more components comprise at least one of the one or more non-CDR components. In an embodiment, the one or more adjustable parameters are selected from a group consisting of amplitude, bandwidth, jitter, and noise level.

In an embodiment, the method further comprises adjusting the one or more adjustable parameters of the test signal by tuning at least one of a group consisting of: a tunable resistor, a tunable capacitor, a tunable noise source, a tunable RF source coupled to a delay line, and a tunable current source. In an embodiment, the test signal comprises pseudo-random bits, and the measure is indicative of a number of error bits out of the pseudo-random bits.

In an embodiment, the method further comprises: obtaining a first measure with respect to a first group of components on the substrate; obtaining a second measure with respect to a second group of components on the substrate, the second group being part of the first group; determining a characteristic with respect to a difference set of the first group and the second group based on the first measure and the second measure; and determining whether the difference set functions properly based on the characteristic.

In an embodiment, the first measure is determined by the signal checker upon receipt of the test signal after the test signal passes through the first group of components, and the second measure is determined by the signal checker upon receipt of the test signal after the test signal passes through the second group of components.

In an embodiment, the characteristic is determined based on a difference between the first measure and the second measure. In an embodiment, the first measure is indicative of a first number of error bits received by the signal checker, and the second measure is indicative of a second number of error bits received by the signal checker, and characteristic is determined by: determining a first bit error rate based on the first measure; determining a second bit error rate based on the second measure; and determining a difference between the first bit error rate and the second bit error rate.

In an embodiment, the difference set is determined to function properly when the characteristic is within a threshold, and wherein the difference set is determined to function improperly when the characteristic is above the threshold. In an embodiment, the method further comprises: determining a set of first parameters for the test signal; adjusting the test signal according to the set of first parameters; and determining sensitivity of a second parameter for the test signal, the sensitivity of the second parameter being indicative of a minimal value or a maximal value of the second parameter, given the set of first parameters excluding the second parameter, which allows one or more components that the test signal passes through function properly. In an embodiment, the sensitivity of the second parameter is determined using a linear searching method or a binary searching method.

In an embodiment, the set of first parameters and the second parameter are selected from a group consisting of amplitude, bandwidth, jitter, and noise level, and wherein the second parameter does not belong to the set of first parameters. In an embodiment, the substrate is a silicon substrate.

In an embodiment, there is provided a machine-readable tangible and non-transitory medium having information, wherein the information, when read by a hardware processor system, causes the hardware processor system to perform following: forming a signal generator, one or more non-CDR components, and a CDR component on a substrate, wherein the CDR component is: configured to recover clock data from a received signal by the CDR component, and configured to determine a signal based on the received signal and the clock data; coupling the CDR component to the one or more non-CDR components; and coupling the signal generator to at least one of the one or more non-CDR components.

In an embodiment, the information, when read by the hardware processor system, further causes the hardware processor system to perform following: forming a signal checker on the substrate; and coupling the signal checker to the CDR component or at least one of the one or more non-CDR components.

In an embodiment, the information, when read by the hardware processor system, further causes the hardware processor system to couple the signal generator to the CDR component. In an embodiment, the one or more non-CDR components comprise one or more amplifiers. In an embodiment, the one or more amplifiers comprise a trans-impedance amplifier or a limiting amplifier. In an embodiment, the substrate is a silicon substrate.

In an embodiment, there is provided a machine-readable tangible and non-transitory medium having information, wherein the information, when read by a hardware processor system, causes the hardware processor system to perform a process of using an apparatus, the apparatus comprising: one or more non-CDR components on a substrate; a signal generator on the substrate and coupled to at least one of the one or more non-CDR components; and a CDR component on the substrate and coupled to the one or more non-CDR components, wherein the CDR component is: configured to recover clock data from a received signal by the CDR component, and configured to determine a signal based on the received signal and the clock data, and the process comprising providing, by the signal generator, a test signal with one or more adjustable parameters.

In an embodiment, the process further comprises: passing the test signal subsequently through one or more components selected from a group consisting of the one or more non-CDR components and the CDR component; determining a measure upon receipt of the test signal; and determining whether the one or more components function properly based on the measure.

In an embodiment, the one or more components comprise at least one of the one or more non-CDR components. In an embodiment, the one or more adjustable parameters are selected from a group consisting of amplitude, bandwidth, jitter, and noise level.

In an embodiment, the process further comprises adjusting the one or more adjustable parameters of the test signal by tuning at least one of a group consisting of: a tunable resistor, a tunable capacitor, a tunable noise source, a tunable RF source coupled to a delay line, and a tunable current source.

In an embodiment, the test signal comprises pseudo-random bits, and the measure is indicative of a number of error bits out of the pseudo-random bits. In an embodiment, the process further comprises: obtaining a first measure with respect to a first group of components on the substrate; obtaining a second measure with respect to a second group of components on the substrate, the second group being part of the first group; determining a characteristic with respect to a difference set of the first group and the second group based on the first measure and the second measure; and determining whether the difference set functions properly based on the characteristic.

In an embodiment, the first measure is determined by the signal checker upon receipt of the test signal after the test signal passes through the first group of components, and the second measure is determined by the signal checker upon receipt of the test signal after the test signal passes through the second group of components.

In an embodiment, the characteristic is determined based on a difference between the first measure and the second measure. In an embodiment, the first measure is indicative of a first number of error bits received by the signal checker, and the second measure is indicative of a second number of error bits received by the signal checker, and characteristic is determined by: determining a first bit error rate based on the first measure; determining a second bit error rate based on the second measure; and determining a difference between the first bit error rate and the second bit error rate.

In an embodiment, the difference set is determined to function properly when the characteristic is within a threshold, and wherein the difference set is determined to function improperly when the characteristic is above the threshold.

In an embodiment, the process further comprises: determining a set of first parameters for the test signal; adjusting the test signal according to the set of first parameters; and determining sensitivity of a second parameter for the test signal, the sensitivity of the second parameter being indicative of a minimal value or a maximal value of the second parameter, given the set of first parameters excluding the second parameter, which allows one or more components that the test signal passes through function properly.

In an embodiment, the sensitivity of the second parameter is determined using a linear searching method or a binary searching method. In an embodiment, the set of first parameters and the second parameter are selected from a group consisting of amplitude, bandwidth, jitter, and noise level, and wherein the second parameter does not belong to the set of first parameters. In an embodiment, the substrate is a silicon substrate.

Figure 14:
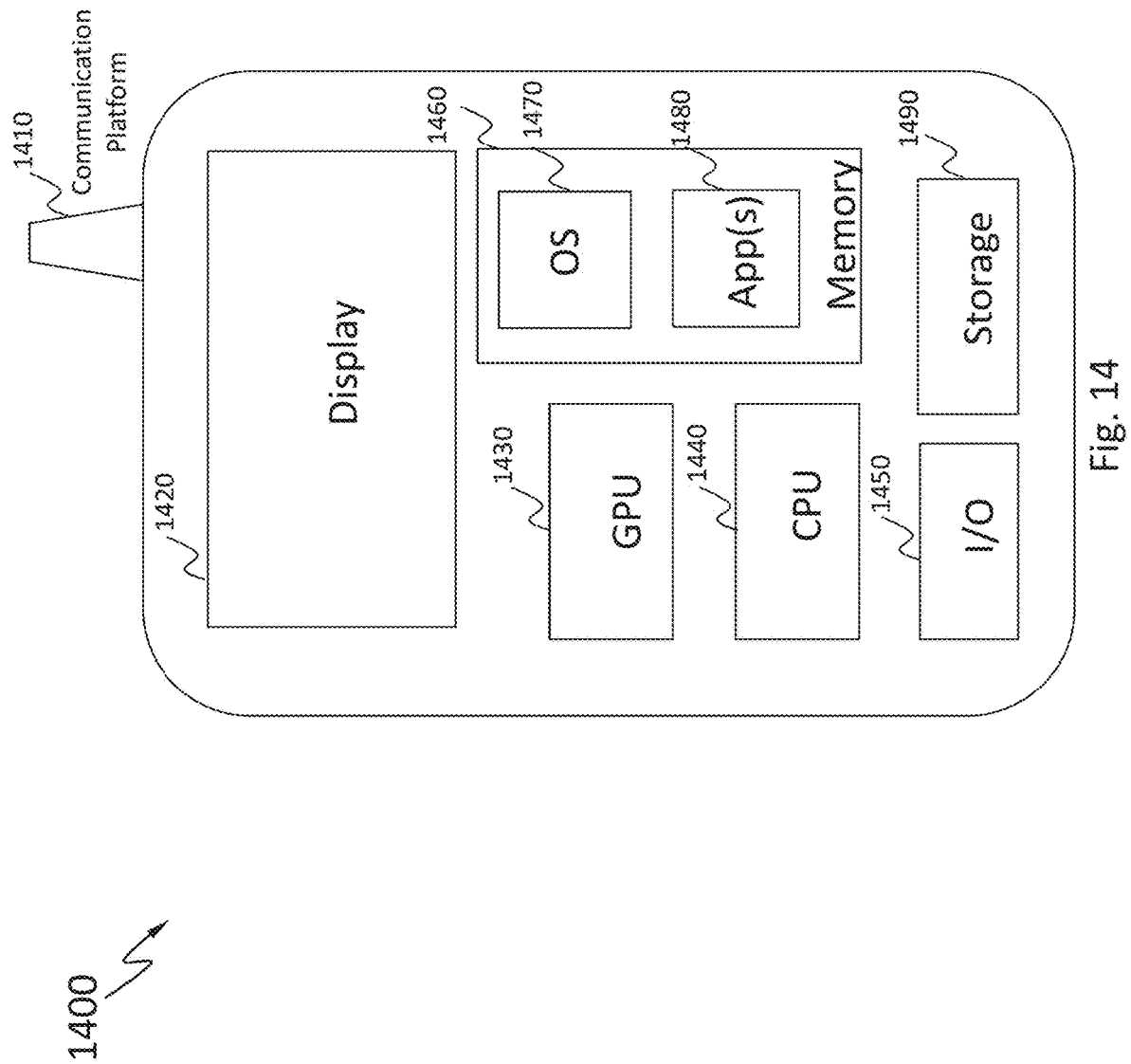
FIG. 14 depicts a general mobile device architecture on which the present teaching can be implemented.

FIG. 14 depicts a general mobile device architecture 1400 on which the present teaching can be implemented and has a functional block diagram illustration of a mobile device hardware platform which includes user interface elements. The mobile device may be a general-purpose mobile device or a special purpose mobile device. In this example, the user device is a mobile device 1400, including but is not limited to, a smart phone, tablet, music player, handled gaming console, and GPS. The mobile device 1400 in this example includes one or more central processing units (CPUs) 1440, one or more graphic processing units (GPUs) 1430, a display 1420, a memory 1460, a communication platform 1410, such as a wireless communication module, one or more operating systems (OS) 1470, storage 1490, and one or more input/output (I/O) devices 1450. Any other suitable component, such as but not limited to a system bus or a controller (not shown), may also be included in the mobile device 1400. As shown in FIG. 14, one or more applications 1480 may be loaded into the memory 1460 from the storage 1490 in order to be executed by the CPU 1440. The applications 1480 may be executed on various mobile operating systems 1470, e.g., iOS, Android, Windows Phone, etc. Execution of the applications 1480 may cause the mobile device 1400 to perform the processing as described above, e.g., in FIGS. 7-13. In an embodiment, the mobile device 1400 may be used as the control terminal as described herein.

FIG. 15 depicts a general computer architecture 1500 on which the present teaching can be implemented and has a functional block diagram illustration of a computer hardware platform which includes user interface elements. The computer may be a general-purpose computer or a special purpose computer. The methods as described above, e.g., in FIGS. 7-13, can all be implemented on one or more computers such as the computer 1500, via its hardware, software program, firmware, or a combination thereof. In an embodiment, the computer 1500 may be used as the control terminal as described herein. Although only one such computer is shown, for convenience, the computer functions relating to dynamic relation and event detection may be implemented in a distributed fashion on a number of similar platforms, to distribute the processing load.

The computer 1500, for example, includes COM ports 1502 connected to and from a network connected thereto to facilitate data communications. The computer 1500 also includes a CPU 1504, in the form of one or more processors, for executing program instructions. The exemplary computer platform includes an internal communication bus 1506, program storage and data storage of different forms, e.g., disk 1508, read only memory (ROM) 1510, or random access memory (RAM) 1512, for various data files to be processed and/or communicated by the computer, as well as possibly program instructions to be executed by the CPU 1504. The computer 1500 also includes an I/O component 1514, supporting input/output flows between the computer and other components therein such as user interface elements 1516. The computer 1500 may also receive programming and data via network communications.

Hence, aspects of the method for presenting personalized content, as outlined above, may be embodied in programming. Program aspects of the technology may be thought of as "products" or "articles of manufacture" typically in the form of executable code and/or associated data that is carried on or embodied in a type of machine readable medium. Tangible non-transitory "storage" type media include any or all of the memory or other storage for the computers, processors or the like, or associated modules thereof, such as various semiconductor memories, tape drives, disk drives and the like, which may provide storage at any time for the computer-implemented method.

All or portions of the computer-implemented method may at times be communicated through a network such as the Internet or various other telecommunication networks. Such communications, for example, may enable loading of the software from one computer or processor into another. Thus, another type of media that may bear the elements of the computer-implemented method includes optical, electrical, and electromagnetic waves, such as used across physical interfaces between local devices, through wired and optical landline networks and over various air-links. The physical elements that carry such waves, such as wired or wireless links, optical links or the like, also may be considered as media bearing the computer-implemented method. As used herein, unless restricted to tangible "storage" media, terms such as computer or machine "readable medium" refer to any medium that participates in providing instructions to a processor for execution.

Hence, a machine readable medium may take many forms, including but not limited to, a tangible storage medium, a carrier wave medium or physical transmission medium. Non-volatile storage media include, for example, optical or magnetic disks, such as any of the storage devices in any computer(s) or the like, which may be used to implement the system or any of its components as shown in the drawings. Volatile storage media include dynamic memory, such as a main memory of such a computer platform. Tangible transmission media include coaxial cables; copper wire and fiber optics, including the wires that form a bus within a computer system. Carrier-wave transmission media can take the form of electric or electromagnetic signals, or acoustic or light waves such as those generated during radio frequency (RF) and infrared (IR) data communications. Common forms of computer-readable media therefore include for example: a floppy disk, a flexible disk, hard disk, magnetic tape, any other magnetic medium, a CD-ROM, DVD or DVD-ROM, any other optical medium, punch cards paper tape, any other physical storage medium with patterns of holes, a RAM, a PROM and EPROM, a FLASH-EPROM, any other memory chip or cartridge, a carrier wave transporting data or instructions, cables or links transporting such a carrier wave, or any other medium from which a computer can read programming code and/or data. Many of these forms of computer readable media may be involved in carrying one or more sequences of one or more instructions to a processor for execution.

Those skilled in the art will recognize that the present teaching is amenable to a variety of modifications and/or enhancements. For example, although the implementation of various components described above may be embodied in a hardware device, it can also be implemented as a firmware, firmware/software combination, firmware/hardware combination, or a hardware/firmware/software combination.

While the foregoing description and drawings represent embodiments of the present teaching, it will be understood that various additions, modifications, and substitutions may be made therein without departing from the spirit and scope of the principles of the present teaching as defined in the accompanying claims. One skilled in the art will appreciate that the present teaching may be used with many modifications of form, structure, arrangement, proportions, materials, elements, and components and otherwise, used in the practice of the disclosure, which are particularly adapted to specific environments and operative requirements without departing from the principles of the present teaching. The presently disclosed embodiments are therefore to be considered in all respects as illustrative and not restrictive, the scope of the present teaching being indicated by the appended claims and their legal equivalents, and not limited to the foregoing description.

What is claimed is:

1. An apparatus comprising:
   one or more non-clock and data recovery (CDR) components comprising one or more amplifiers on a substrate;
   a signal generator on the substrate and configured to provide a test signal for testing one or more components selected from a group consisting of the one or more non-CDR components and a CDR component on the substrate; and
   the CDR component on the substrate and coupled to the one or more non-CDR components, wherein the CDR component is:
       configured to recover clock data from an electrical signal received by the the one or more non-CDR components, and
       configured to generate a recovered data signal based on the electrical signal and the clock data.

2. The apparatus of claim 1, wherein the one or more amplifiers comprise a trans-impedance amplifier or a limiting amplifier.

3. The apparatus of claim 1, further comprising a signal checker on the substrate and coupled to the CDR component or at least one of the one or more non-CDR components, wherein the signal checker is configured to determine a measure upon receipt of the test signal after the test signal passes through the one or more components selected from the group consisting of the one or more non-CDR components and the CDR component.

4. The apparatus of claim 1, further comprising a signal adjuster on the substrate and coupled to the signal generator, wherein the signal adjuster is configured to adjust one or more parameters of the test signal.

5. The apparatus of claim 4, wherein the one or more parameters of the test signal are selected from a group consisting of amplitude, bandwidth, jitter, and noise level.

6. The apparatus of claim 5, wherein the signal adjuster comprises an amplifier coupled to a tunable current source, and wherein the amplifier and the tunable current source are collectively configured to adjust amplitude of the test signal, gain of the amplifier being adjustable through tuning the tunable current source.

7. The apparatus of claim 5, wherein the signal adjuster comprises a tunable resistor or a tunable capacitor, and wherein the tunable resistor or the tunable capacitor is configured to adjust the bandwidth of the test signal.

8. The apparatus of claim 5, wherein the signal adjuster comprises a delay line coupled to a tunable radio-frequency (RF) source, and wherein the delay line and the tunable RF source are collectively configured to adjust the jitter of the test signal.

9. The apparatus of claim 8, wherein the tunable RF source is configured to provide sinusoidal RF signals with tunable frequency or tunable power.

10. The apparatus of claim 5, wherein the signal adjuster comprises a tunable noise source configured to adjust noise level applied to the test signal.

11. The apparatus of claim 4, further comprising a programmable switch coupled to the signal adjuster and at least two components selected from a group consisting of the CDR component and the one or more non-CDR components.

12. The apparatus of claim 11, wherein the programmable switch is configured to selectively direct the test signal to a component selected from a group consisting of the one or more non-CDR components and the CDR component.

* * * * *